(12) United States Patent
Liang et al.

(10) Patent No.: US 11,812,234 B1
(45) Date of Patent: Nov. 7, 2023

(54) METHOD OF TABLE LEARNING WITH REDUCED LEARNING RATE APPLIED IN DRIVING CIRCUIT AND DRIVING CIRCUIT USING THE SAME

(71) Applicant: xMEMS Labs, Inc., Santa Clara, CA (US)

(72) Inventors: Jemm Yue Liang, Sunnyvale, CA (US); Hung-Chi Huang, Taoyuan (TW); Chieh-Yao Chang, Taipei (TW)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 18/356,234

(22) Filed: Jul. 21, 2023

Related U.S. Application Data

(63) Continuation-in-part of application No. 18/177,765, filed on Mar. 3, 2023, and a continuation-in-part of application No. 18/048,852, filed on Oct. 23, 2022, now Pat. No. 11,757,360, said application No. 18/177,765 is a continuation-in-part of application No. 18/048,852, filed on Oct. 23, 2022, now Pat. No. 11,757,360.

(Continued)

(51) Int. Cl.
*H04R 3/00* (2006.01)
*H03K 3/017* (2006.01)

(52) U.S. Cl.
CPC ............... *H04R 3/00* (2013.01); *H03K 3/017* (2013.01)

(58) Field of Classification Search
None
See application file for complete search history.

(56) References Cited

U.S. PATENT DOCUMENTS 6,088,243 A   7/2000   Shin
6,166,527 A   12/2000  Dwelley
(Continued)

FOREIGN PATENT DOCUMENTS

CN   109634124 A   4/2019

OTHER PUBLICATIONS

Jinfeng Liu et al., "A Two-Tier Control Architecture for Nonlinear Process Systems with Continuous/Asynchronous Feedback", 2009 American Control Conference, Jun. 10-12, 2009, USA, pp. 133-140., 2009.

*Primary Examiner* — Mohammad Ali
*Assistant Examiner* — David Earl Ogg
(74) *Attorney, Agent, or Firm* — Winston Hsu

(57) ABSTRACT

A method is applied in a controller within a driving circuit comprising a driving sub-circuit configured to drive a load. The method comprises steps of: performing a table learning operation on a table at least at a first rate during a learning period; and performing the table learning operation on the table at a second rate lower than the first rate after the learning period; wherein the table is stored in a memory within the controller. The table learning operation comprises steps of: receiving a first feedback signal from the load corresponding to a first cycle; obtaining a control code from the table according to the first feedback signal; generating a control signal according to the control code; receiving a second feedback signal from the load corresponding to the second cycle; and updating the control code and saving the updated control code back to the table in the memory.

25 Claims, 10 Drawing Sheets

Related U.S. Application Data

(60) Provisional application No. 63/459,314, filed on Apr. 14, 2023, provisional application No. 63/435,214, filed on Dec. 23, 2022, provisional application No. 63/269,041, filed on Mar. 8, 2022.

(56) References Cited

U.S. PATENT DOCUMENTS

| | | |
|---|---|---|
| 6,191,567 B1 | 2/2001 | Sluijs |
| 6,215,286 B1 | 4/2001 | Scoones |
| 6,299,272 B1 | 10/2001 | Baker |
| 6,348,779 B1 | 2/2002 | Sluijs |
| 6,984,967 B2 | 1/2006 | Notman |
| 7,391,190 B1 | 6/2008 | Rajagopalan |
| 7,609,040 B1 | 10/2009 | Jain |
| 7,923,980 B2 | 4/2011 | Takahashi |
| 8,400,130 B2 * | 3/2013 | Latham .................. H02M 3/157 |
| | | 323/283 |
| 8,975,826 B1 | 3/2015 | Stevens |
| 8,976,543 B1 | 3/2015 | Zheng |
| 2007/0176587 A1 | 8/2007 | Lipcsei |
| 2009/0296805 A1 | 12/2009 | Takahashi |
| 2016/0091541 A1 | 3/2016 | Matsui |
| 2016/0268889 A1 | 9/2016 | Henzler |
| 2016/0282820 A1 * | 9/2016 | Perez ................... G05B 13/047 |
| 2018/0308467 A1 * | 10/2018 | Yamkovoy ........ G10K 11/17833 |
| 2021/0143767 A1 | 5/2021 | Roadley-Battin |
| 2021/0391869 A1 | 12/2021 | Deford |
| 2022/0021305 A1 * | 1/2022 | Dearborn ................. G05F 1/561 |
| 2022/0209647 A1 | 6/2022 | Yamada |
| 2022/0308531 A1 * | 9/2022 | Takano ................... H02P 23/20 |

\* cited by examiner

| n1\n2 | ΔV | 2ΔV | 3ΔV | 4ΔV | 5ΔV | 6ΔV | 7ΔV |
|---|---|---|---|---|---|---|---|
| ... | | | | | | | |
| 29 | 45 | 66 | 79 | 89 | 96 | 102 | 108 |
| 30 | 49 | 70 | 83 | 92 | 100 | 106 | 111 |
| 31 | 52 | 73 | 86 | 95 | 103 | 109 | 114 |
| 32 | 54 | 76 | 89 | 98 | 105 | 111 | 116 |
| 33 | 57 | 78 | 91 | 100 | 107 | 113 | 118 |
| 34 | 59 | 80 | 93 | 102 | 110 | 115 | 120 |
| 35 | 61 | 82 | 95 | 104 | 111 | 117 | 122 |
| 36 | 62 | 84 | 97 | 106 | 113 | 119 | 123 |
| ... | | | | | | | |

FIG. 5

METHOD OF TABLE LEARNING WITH REDUCED LEARNING RATE APPLIED IN DRIVING CIRCUIT AND DRIVING CIRCUIT USING THE SAME

CROSS REFERENCE TO RELATED APPLICATIONS

This application is a continuation-in-part of U.S. application Ser. No. 18/048,852, filed on Oct. 23, 2022, which claims the benefit of U.S. Provisional Application No. 63/269,041, filed on Mar. 8, 2022. Further, this application is a continuation-in-part of U.S. application Ser. No. 18/177,765, filed on Mar. 3, 2023, which is a continuation-in-part of U.S. application Ser. No. 18/048,852, filed on Oct. 23, 2022, and claims the benefit of U.S. Provisional Application No. 63/435,214, filed on Dec. 23, 2022. Further, this application claims the benefit of U.S. Provisional Application No. 63/459,314, filed on Apr. 14, 2023. The contents of these applications are incorporated herein by reference.

BACKGROUND OF THE INVENTION

1. Field of the Invention

The present invention relates to a method applied in a driving circuit, and more particularly, to a method applied in a driving circuit capable of accommodating various operating conditions with low power.

2. Description of the Prior Art

Recently, piezoelectric-actuated speakers (piezo-speakers) have emerged. Due to the capacitive nature of thin film piezoelectric actuators, these piezo-speakers present highly capacitive loads to the amplifiers. Conventional driving circuits, such as class-AB, -D, -G, -H amplifiers, have all evolved assuming the loading (coils made of very fine wires) will be mostly resistive and slightly inductive, and those amplifiers are not suitable/designed for driving the highly capacitive loads such as piezo-speakers.

Driving circuit with DC-DC converter with energy recycling capability is developed to drive capacitive piezo-speaker. Performance of DC-DC-included driving circuit relies on providing pulse width modulation (PWM) signals (as gate control signals) with precise pulse width. Therefore, how to generate PWM signals with precise pulse width, especially when circuit parameter varies from device to device and circuit operating condition, such as battery voltage level, fluctuates is a significant objective in the field.

SUMMARY OF THE INVENTION

It is therefore an objective of the present invention to provide a table learning method which is capable of adaptively adjusting a pulse width control code (PWCC) used for generating the pulse width modulation (PWM) signals during the operations of the energy recycling amplifier, in order to solve the above mentioned problems.

An embodiment of the present invention discloses a method applied in a controller within a driving circuit comprising a driving sub-circuit configured to drive a load. The method comprises steps of: performing a table learning operation on a table at least at a first rate during a learning period; and performing the table learning operation on the table at a second rate lower than the first rate after the learning period; wherein the table is stored in a memory within the controller. The table learning operation comprises steps of: receiving a first feedback signal from the load corresponding to a first cycle; obtaining a control code from the table according to the first feedback signal; generating a control signal according to the control code, wherein the driving sub-circuit circuit performs an operation on the load according to the control signal during a second cycle; receiving a second feedback signal from the load corresponding to the second cycle; and updating the control code according to the first feedback signal and the second feedback signal, and saving the updated control code back to the table in the memory.

Another embodiment of the present invention discloses a driving circuit. The driving circuit comprises: a driving sub-circuit, coupled to a load; and a controller, comprising a memory in which a table is stored. The controller is configured to control the driving sub-circuit and perform following steps: performing a table learning operation on the table at least at a first rate during a learning period; and performing the table learning operation on the table at a second rate lower than the first rate after the learning period. The table learning operation comprises steps of: receiving a first feedback signal from the load corresponding to a first cycle; obtaining a control code from the table according to the first feedback signal; generating a control signal according to the control code, wherein the driving sub-circuit circuit performs an operation on the load according to the control signal during a second cycle; receiving a second feedback signal from the load corresponding to the second cycle; and updating the control code according to the first feedback signal and the second feedback signal, and saving the updated control code back to the table in the memory.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 illustrates an exemplary LUT recording the PWCCs according to an embodiment of the present invention.

DETAILED DESCRIPTION

U.S. Pat. Nos. 11,290,015, 11,133,784 and 11,336,182 have disclosed an energy recycling amplifier which includes a DC-DC converter for driving capacitive loads, especially for capacitive speaker loads of the piezo-speakers. The DC-DC converter is usually controlled by pulse width modulation (PWM) signals. U.S. Pat. No. 11,271,480 discloses a method of pre-calculating pulse width information associated with the PWM signals and saving the information as pulse width control codes (PWCC) in an addressable table memory.

The calculation of the control codes may be affected by various factors, including variable features of the piezo-speaker, offsets of the DC-DC converter, fluctuation of battery voltage level, and manufacturing mismatch of the related driving circuit. For example, the inductance of the inductor used in the DC-DC converter usually has a tolerance error, which results in inconstant charging/discharging behaviors of the DC-DC converter. Permittivity/capacitance of piezo-speaker varies with respect to the voltage applied thereon. Additionally, the permittivity curve relative to the supplied voltage of every piezo-speaker may not be exactly identical, and/or the circuit elements of the energy recycling amplifier and its driving circuit usually have manufacturing mismatch. Those errors and mismatches will cause the voltage increments and decrements generated by the control codes to be inaccurate in the (dis)charging operations. The inaccuracy of (dis)charging operations performed on the piezo-speaker may increase/bring the distortion and error of the output signals, therefore degrading the sound quality.

The present invention provides (at least) a table learning method, which can adaptively adjust pulse width control code and be able to accommodate devices with various parameter(s). Before the table learning is elaborated, driving circuit in which table learning algorithm is realized is introduced first.

In the present invention, the term "coupled to" may refer to direct or indirect connection. "Component A being coupled to component B" may indicate that component A is directly connected to component B, or component A is connected to component B via some component C.

Figure 1:
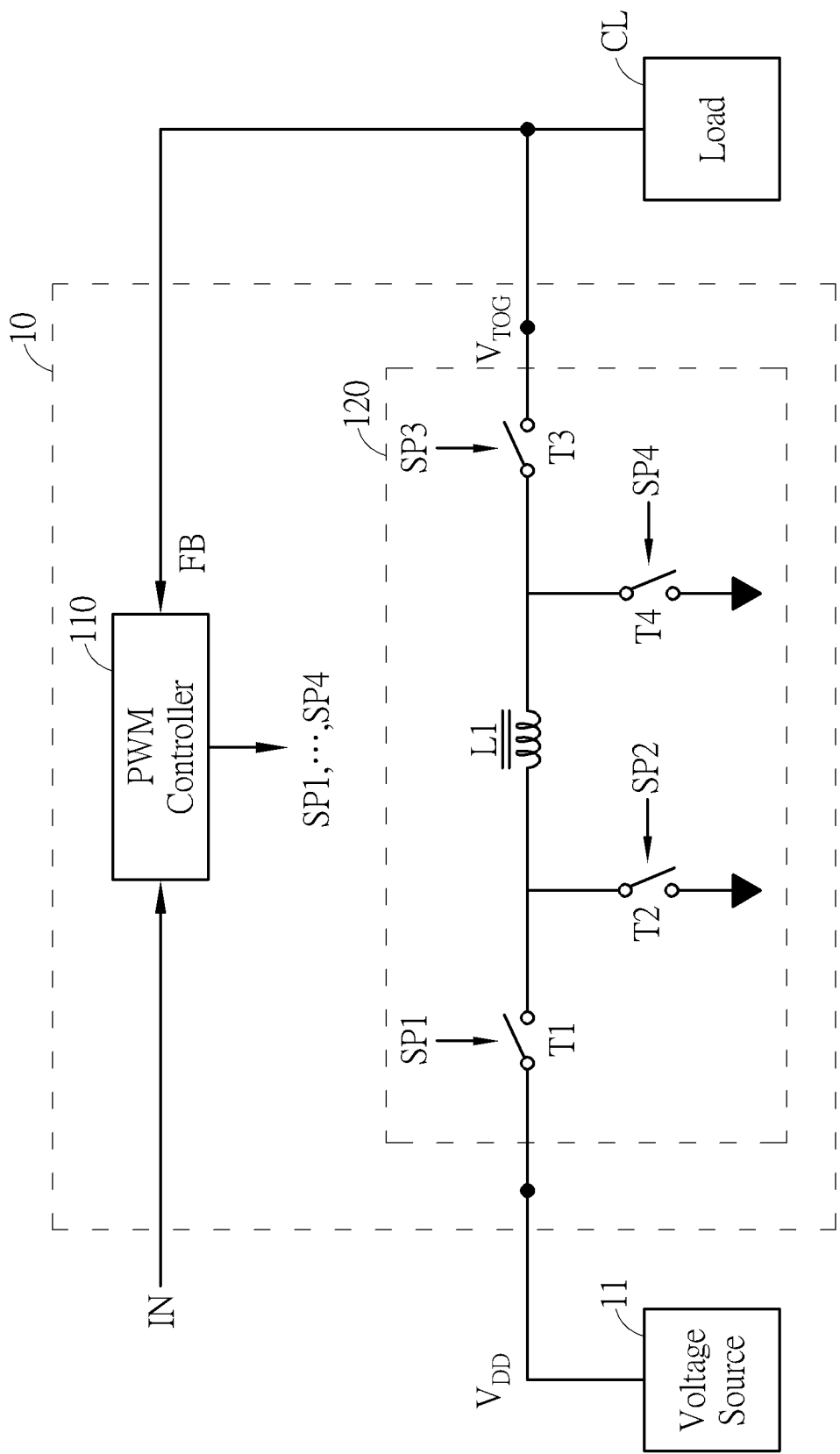
FIG. 1 is a schematic diagram of a driving circuit according to an embodiment of the present invention.

FIG. 1 is a schematic diagram of a driving circuit 10 according to an embodiment of the present invention. The driving circuit 10 includes a pulse width modulation (PWM) controller 110 and a bidirectional circuit 120. The bidirectional circuit 120 is coupled between a voltage source (or called a power source, such as a battery) 11 and a capacitive load CL, and configured to drive the capacitive load CL. In an embodiment, the capacitive load CL may include a piezoelectric-actuated speaker (abbreviated as piezo-speaker hereinafter), which generates sounds as being driven by the driving circuit 10. The bidirectional circuit 120 may receive a source voltage $V_{DD}$ from the voltage source 11, and supply current to or drain current from the capacitive load CL. The voltage $V_{TOG}$ represents a voltage at an output terminal of the bidirectional circuit 120. In an embodiment, the driving circuit 10 may be an energy recycling amplifier, and the bidirectional circuit 120 may be a DC-DC converter which is capable of Energy recycling. Details of DC-DC converter utilized as driving circuit with energy recycle capability is taught in U.S. Pat. Nos. 11,271,480 and 11,336,182, which are not narrated herein for brevity.

In an embodiment, the load CL herein may be a capacitive speaker load, e.g., a piezo-actuated speaker. The driving circuit 10 may receive an input signal IN which is generated according to an original audio signal within an audible band (e.g., between 16.5 Hz to 22 KHz). The driving circuit drives the capacitive speaker load according to the input signal IN, such that an output of the capacitive speaker load is substantially proportional to the input signal IN. In the present application, a signal a being substantially proportional to a signal b may refer that, $\|a(t)-c \cdot b(t)\|^2 \leq \varepsilon$ is satisfied, where $\|s(t)\|^2$ may represent an energy of an arbitrary signal s(t), a(t) and b(t) represent time-varying function of the signal a and the signal b, respectively, c represents a constant which can be either positive or negative, and E represent some positive small number which may be, e.g., $10^{-1}$, $10^{-2}$, $10^{-3}$, etc.

The bidirectional circuit 120 includes an inductor L1 and four switches T1-T4. The switch T1 is coupled between a first terminal of the inductor L1 and the voltage source 11. The switch T2 is coupled between the first terminal of the inductor L1 and the ground terminal. The switch T3 is coupled between a second terminal of the inductor L1 and the capacitive load CL. The switch T4 is coupled between the second terminal of the inductor L1 and the ground terminal. The bidirectional circuit 120 may operate by receiving PWM signals SP1-SP4 from the PWM controller 110, where the switches T1-T4 are controlled by the PWM signals SP1-SP4, respectively.

The PWM controller 110 may control the bidirectional circuit 120 to operate in a charging phase or a discharging phase. In the charging operation, the bidirectional circuit 120 may supply a charging current to charge the capacitive load CL. The charging phase includes an InFlux phase (i.e., magnetic flux-increasing phase) and a DeFlux phase (i.e., magnetic flux-decreasing phase). In the Influx phase of the charging operation, the switches T1 and T4 are turned on and the switches T2 and T3 are turned off, and an InFlux current flowing from the voltage source 11 through the inductor L1 may form a magnetic flux with magnetic energies (to be) stored in the inductor L1. In the DeFlux phase of the charging operation following the InFlux phase, the switches T2 and T3 are turned on and the switches T1 and T4 are turned off, and the magnetic energies stored in the inductor L1 may be converted into electric energies which are output to the capacitive load CL via electric current flowing toward the capacitive load CL.

In the discharging operation, the bidirectional circuit 120 may form/drain a discharging current from the capacitive load CL, and the energies carried by the discharging current may be transferred to the voltage source 11 and recycled by/via a battery or capacitor of the voltage source 11. The discharging phase may also include an InFlux phase and a DeFlux phase. In the InFlux phase of the discharging operation, the switches T2 and T3 are turned on and the switches T1 and T4 are turned off, and the discharging current flowing from the capacitive load CL through the inductor L1 may form a magnetic flux with magnetic energies (to be) stored in the inductor L1. In the DeFlux phase of the discharging operation following the InFlux phase, the switches T1 and T4 are turned on and the switches T2 and T3 are turned off, and the magnetic energies stored in the inductor L1 may be converted into electric energies which are output to and recycled in the voltage source 11 via electric current flowing toward the voltage source 11.

Please note that InFlux current path and DeFlux current path in the above paragraphs are for illustrating purpose. Those skilled in the art may make modifications or alterations based on practical situation. For example, in the InFlux phase of the discharging operation, the switches T1 and T3 may be simultaneously turned on while the switches T2 and T4 are turned off, and the InFlux current may flow from the load CL directly to the voltage source, which may be applicable especially when the load voltage $V_{TOG}$ is much higher than the source voltage $V_{DD}$. In this case, the InFlux current flowing through the inductor L1 and corresponding power consumed on the inductor L1 are reduced.

The PWM controller 110 may receive a feedback signal FB from the capacitive load CL and also receive an input signal IN, in order to determine the pulse widths of the PWM signals SP1-SP4. In an acoustic application, such as high-fidelity amplifier, where the capacitive load CL includes a piezo-speaker, the PWM controller 110 may output the PWM signals SP1-SP4 as gate control signals for the switches T1-T4 to control the charging/discharging behavior of the bidirectional circuit 120, to minimize the difference between the feedback signal FB and the input signal IN. Therefore, based on the difference between the feedback signal FB and the input signal IN, the PWM controller 110 may determine whether to charge or discharge the capacitive load CL and also determine the amount of charge to be transferred during charging/discharging provided by the bidirectional circuit 120 in each operation cycle of the bidirectional circuit 120, so as to minimize the difference between the feedback signal FB and the input signal IN continuously. Within a period of an operation cycle, the charging or discharging operation is accomplished at least one time, by the bidirectional circuit 120. The detailed implementations and operations of the bidirectional circuit 120 are disclosed in U.S. Pat. No. 11,336,182, and thus omitted herein for brevity.

Figure 2:
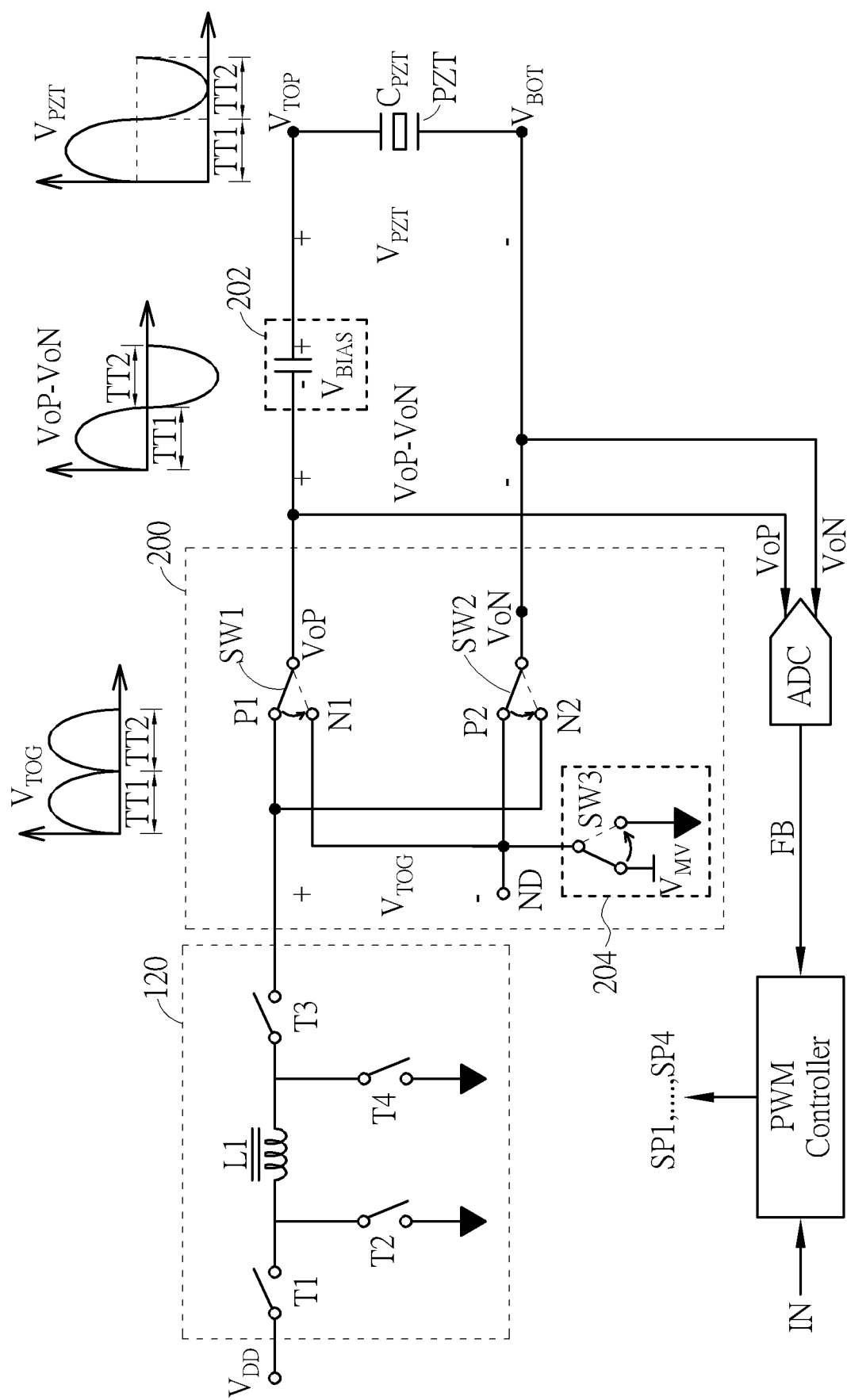
FIG. 2 is a schematic diagram of an exemplary implementation of the bidirectional circuit with the capacitive load according to an embodiment of the present invention.

FIG. 2 is a schematic diagram of an exemplary implementation of the bidirectional circuit 120 with the capacitive load CL according to an embodiment of the present invention. In this embodiment, the piezo-speaker is actuated by thin-film actuator (with, e.g., lead zirconate titanate, abbreviated as PZT, material) whose capacitive load CL is represented by a capacitor $C_{PZT}$. The bidirectional circuit 120 has a single-ended output while the piezo-speaker PZT has a first terminal (e.g., top electrode) and a second terminal (e.g., bottom electrode). In the embodiment shown in FIG. 2, the bidirectional circuit 120 is coupled to the PZT actuator of the piezo-speaker through a single-ended to differential converter 200 and a bias voltage generator 202.

The single-ended to differential converter 200 is configured to output a differential voltage VoP and VoN based on the voltage $V_{TOG}$ output by the bidirectional circuit 120. Under the characteristics of the DC-DC converter, the voltage $V_{TOG}$ output by the bidirectional circuit 120 is unipolar and may be regarded as positive (if the source voltage $V_{DD}$ is positive). In other words, the voltage $V_{TOG}$ may rise in the charging phase and fall in the discharging phase.

The single-ended to differential converter 200 provides a switching/toggling mechanism to extend the voltage swing range to drive the piezo-speaker, denoted as PZT. In detail, the single-ended to differential converter 200 includes two switches SW1 and SW2. The switch SW1 is configured to selectively couple the first terminal of the piezo-speaker PZT to the output terminal of the bidirectional circuit 120 or a node ND. The switch SW2 is configured to selectively couple the second terminal of the piezo-speaker PZT to the output terminal of the bidirectional circuit 120 or the node ND.

In a first period TT1, the switch SW1 is connected to the node P1 and the switch SW2 is connected to the node P2; hence, terminal $V_{TOP}$ of the piezo-speaker PZT is coupled to the output terminal of the bidirectional circuit 120 and terminal $V_{BOT}$ of the piezo-speaker PZT is coupled to the node ND. In such a situation, the differential voltage VoP minus VoN is identical to the voltage $V_{TOG}$ output by the bidirectional circuit 120. In a second period TT2, the switch SW1 is connected to the node N1 and the switch SW2 is connected to the node N2; hence, terminal $V_{TOP}$ of the piezo-speaker PZT is coupled to the node ND and terminal $V_{BOT}$ of the piezo-speaker PZT is coupled to the output terminal of the bidirectional circuit 120. In such a situation, the differential voltage $V_{TOP}-V_{BOT}$=VoP−VoN equals−$V_{TOG}$ outputted by the bidirectional circuit 120.

In other words, the switches SW1 and SW2 may be controlled by a first control signal, such that the switches SW1 and SW2 are switched to the nodes P1 and P2, respectively, at the same time, and/or the switches SW1 and SW2 are switched to the nodes N1 and N2, respectively, at the same time.

Most of the thin film PZT material available presently supports only unipolar operation. In order to utilize such unipolar thin film PZT as actuator for the piezo-speaker, a bias voltage generator 202 may be optionally coupled between the single-ended to differential converter 200 and the piezo-speaker to provide a bias voltage $V_{BIAS}$ where $V_{BIAS} \approx \max(\text{VoN} - \text{VoP})$ and therefore guarantee $V_{TOP}$=VoP+$V_{BIAS} \geq$ VON=$V_{BOT}$ and fulfill the unipolar requirement.

In an embodiment, the piezo-speaker includes a membrane which moves when the PZT actuator is being driven by a driving voltage $V_{PZT}$ across the piezo-speaker PZT; that is, the driving voltage $V_{PZT}$ refers to the difference between a voltage $V_{TOP}$ at the first terminal (top electrode) of the piezo-speaker PZT and a voltage $V_{BOT}$ at the second terminal (bottom electrode) of the PZT actuator of the piezo-speaker. This driving voltage $V_{PZT}$ will cause the membrane to deform, generating a displacement, and such displacement moves/compresses the air to generate the sounds. The position of the membrane of the piezo-speaker is controlled by the applied $V_{PZT}$. When the membrane is placed horizontally, the membrane will bend upwards progressively when the driving voltage $V_{PZT}$ increases and membrane will bend downwards progressively when the driving voltage $V_{PZT}$ decreases. In other words, the vertical displacement of the membrane may be controlled by the driving voltage $V_{PTZ}$ and the membrane may be controlled to be in an intermediate position by changing the driving voltage $V_{PZT}$.

In an exemplary embodiment, the voltage VTOL output by the bidirectional circuit 120 may swing between 0V and +15V, so that the differential voltage VoP−VoN may swing between +15V and −15V (i.e., between 0V and +15V in the first period TT1 and between 0V and −15V in the second period TT2, as stated and shown in FIG. 2). In such a situation, the bias voltage $V_{BIAS}$ may be designed to equal 15V, resulting in that the driving voltage $V_{PZT}$ of the piezo-speaker PZT may swing between 0V and 30V, which guarantees that the piezo-speaker PZT can receive the driving voltage $V_{PZT}$ which is unipolar. The relation between the driving voltage $V_{PZT}$ and the voltages VoP and VoN output by the single-ended to differential converter 200 may be expressed as follows:

$$V_{PZT}=V_{TOP}-V_{BOT}=(VoP+V_{BIAS})-VON.$$

As shown in FIG. 2, the single-ended to differential converter 200 may further include a voltage shift circuit 204. The voltage shift circuit 204 includes a switch SW3 selectively coupled to a ground terminal or a voltage source providing a shift voltage $V_{MV}$. In general operations, the switch SW3 may be coupled to the ground terminal. However, when the voltage $V_{TOG}$ is close to the ground voltage, the discharge currents may not easily flow to/through the inductor L1, therefore reducing the efficiency/effect of the bidirectional circuit 120. In order to solve this problem, when the voltage $V_{TOG}$ is close to the ground voltage, the switch SW3 is switched to receive the shift voltage $V_{MV}$, which couples the voltage $V_{TOG}$ to/toward a higher level. This increases the magnetic flux increasing capability of the inductor L1 to facilitate the InFlux operation, allowing the discharging to be performed more efficiently/effectively. In an embodiment, the shift voltage $V_{MV}$ may equal $V_{DD}$, the source voltage supplied to the bidirectional circuit 120, or $V_{MV}=V_{DD}$. However, the shift voltage $V_{MV}$ may have any other appropriate value and not limited to $V_{DD}$ thereof.

In other words, the voltage shift circuit 204 or the switch SW3 may be controlled by a second control signal, where the second control signal is generated according to the input signal IN or the feedback signal FB. The voltage shift circuit 204 or the switch SW3 may selectively apply the shift voltage $V_{MV}$ to the node ND when a magnitude of the input signal IN or the feedback signal FB is less than a certain threshold.

Referring to FIG. 1 along with FIG. 2, the PWM controller 110 receives the feedback signal FB from the capacitive load CL such as the piezo-speaker PZT. The feedback signal FB should appropriately reflect/represent the driving voltage $V_{PZT}$ applied to the piezo-speaker PZT, so that the PWM controller 110 is able to determine whether to perform charging or discharging on the piezo-speaker PZT based on the relationship of the feedback signal FB and the input signal IN. In an embodiment, the feedback signal FB may be expressed as follows:

$FB=ADC\{VoP-VoN\}.$

In other words, the PWM controller 110 may receive the feedback signal FB after the differential voltage VoP-VoN is converted into a digital form through an analog-to-digital converter, such as demonstrated by the ADC shown in FIG. 2.

As mentioned above, the PWM controller 110 may output the PWM signals SP1-SP4 to control the bidirectional circuit 120, where the pulse widths of the PWM signals SP1-SP4 are determined based on the input signal IN and the feedback signal FB. In an embodiment, the PWM controller 110 may retrieve and/or update the pulse width control codes (PWCCs) used for generating the PWM signals SP1-SP4. The PWCCs may be pre-/re-calculated or adjusted according to the relationship between the input signal IN and the feedback signal FB, and these updated PWCCs may be stored in a PWCC lookup table in the memory for future reference.

Specifically, based on relationship between the input signal IN and the feedback signal FB, the quantities of electric charges to be charged into, or to be discharged from, the $C_{PZT}$ and the corresponding control code needed by the bidirectional circuit 120 to control PWM pulse widths, i.e. PWCC, to perform such charging/discharging operation, may be adjusted or re-calculated and the corresponding entry in the PWCC lookup table may be updated accordingly. During a subsequent operation cycle, the PWM controller 110 may fetch any thusly adjusted or re-calculated PWCC from the PWCC lookup table according to the received input signal IN and feedback signal FB and use this retrieved PWCC to control the pulse widths of the PWM signals SP1-SP4.

Figure 3:
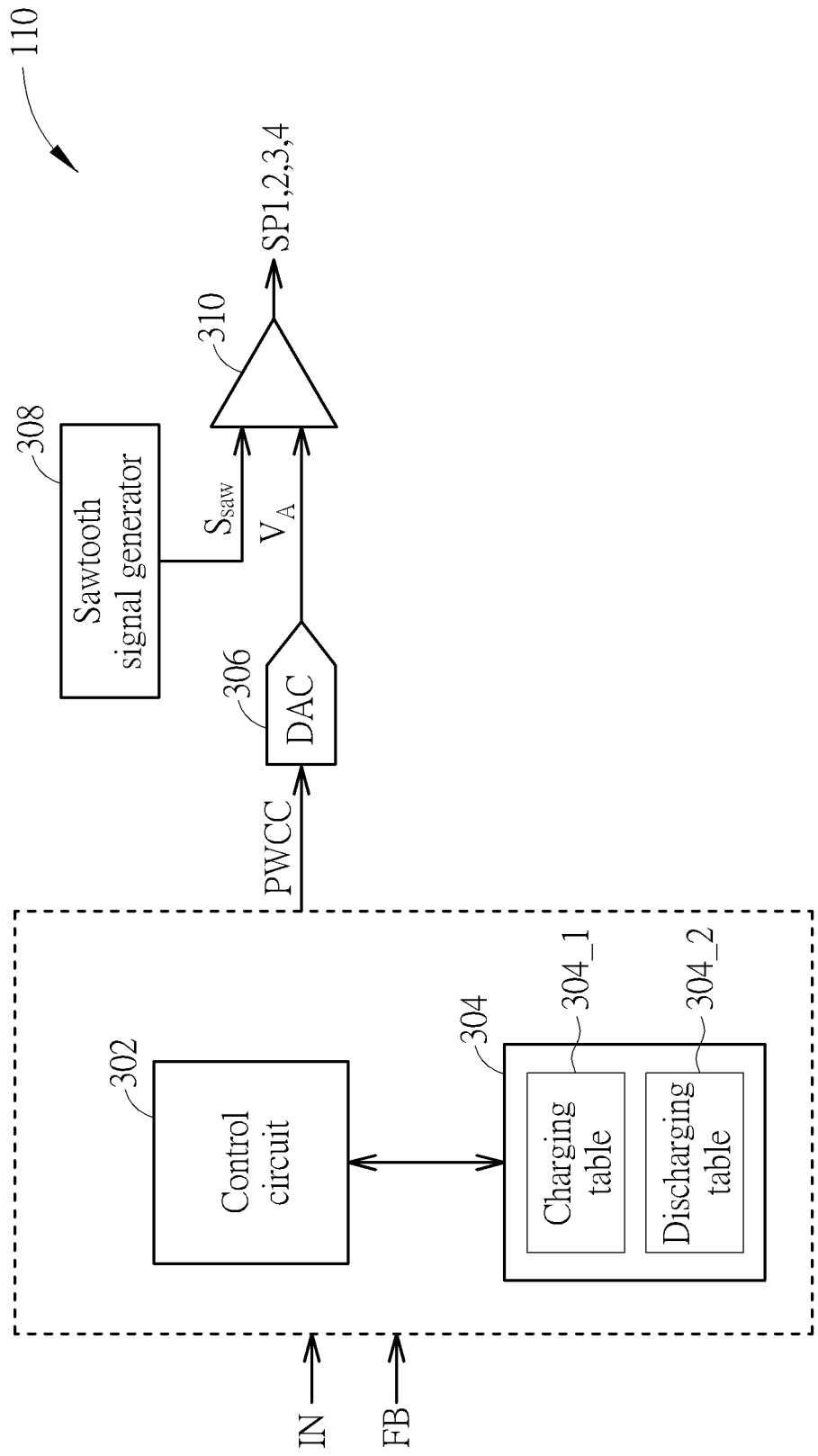
FIG. 3 is a schematic diagram of a detailed implementation of the PWM controller.

FIG. 3 is a schematic diagram of one embodiment of the PWM controller 110. The PWM controller 110 includes a control circuit 302, a memory 304, a digital-to-analog converter (DAC) 306, a sawtooth signal generator (or waveform generator) 308 and a comparator 310. In this embodiment, the PWCCs are stored as one or more look-up tables (LUTs) in the memory 304. For example, the memory 304 may include a charging table/LUT 304_1 and a discharging table/LUT 304_2. The charging LUT 304_1 is configured to store the PWCCs used to generate the PWM signals SP1-SP4 for the charging operation. The discharging LUT 304_2 is configured to store the PWCCs used to generate the PWM signals SP1-SP4 for the discharging operation.

The control circuit 302 determines whether the bidirectional circuit 120 should operate in the charging operation or the discharging operation according to the input signal IN and the feedback signal FB. For example, let $\Delta$=IN-FB, a charging operation will be initiated to increase $V_{PZT}$ when $\Delta>\Delta_{min}$ and a discharging operation will be initiated to reduce $V_{PZT}$ when $\Delta<-\Delta_{min}$, where $\Delta_{min}$ is the threshold, typically a small positive value, determined by system designer according to performance requirements. Thereby, control circuit 302 may use IN, FB to determine whether to retrieve the PWCC from LUT 304_1 or LUT 304_2. Furthermore, by examining the resulting $V_{PZT}$ at the end of the cycle of charge-/discharge-operation against the target value, for example by checking whether $|\Delta|>\Delta_{min}$, the control circuit 302 may execute additional steps to update the PWCC stored in LUT by a table learning process to be stated in the present invention.

PWM controller 110 of FIG. 1 controls the generations of PWM signals SP1-SP4 by retrieving PWCC's from appropriate LUT stored in memory 304 of FIG. 3, which illustrate the detail of how a PWM signal corresponding to a PWCC is generated by the controller 320. The PWCC stored in the memory 304 is in the form of digital codes. In addition to the pulse width (in time) of each pulse, this digital code of PWCC may contain data such as number of PWM pulses to generate, etc. Generally, PWCCs may refer to any information pertaining to the generating and use of the PWM pulses and are not limited by the embodiments disclosed in this invention thereof. These PWCCs are used to produce the different input (digital) values to DAC 306 to produce different output (analog) voltage levels $V_A$ to control the pulse widths of SP1-SP4. By comparing voltage levels $V_A$ to a sawtooth signal $S_{saw}$ (or sawtooth-like signal with flat tip) generated by the sawtooth signal generator 308, the comparator 310 will generate pulses whose pulse widths (in time) are determined by voltage levels of $V_A$. Namely, the pulse widths of the generated PWM signal, such as SP1-SP4, are determined by the output voltage levels $V_A$ of DAC 306, generated according to the input values derived from corresponding PWCCs.

In an embodiment, the DAC 306 conversion may have a monotonic relationship between its digital input value and its analog output voltage level $V_A$, meaning the relationship of the pulse width (in time) of the PWM signal and the digital pulse width information contained within the PWCC digital code is monotonic. In an embodiment, a larger PWCC digital code is used to generate a pulse with longer/wider (in time) pulse width and a smaller/narrower PWCC digital code is used to generate a pulse with shorter (in time) pulse width; that is, the larger the PWCC, the longer/wider the pulse width. In this embodiment, the bigger is the difference between the input signal IN and the feedback signal FB (i.e. the larger the $|\Delta|$ is), the more amount of electric charges needs to be added or removed from $C_{PZT}$ during the charge-/discharge-operation, the longer/wider the pulse width of the PWM signal should be, and the larger the PWCC should be. Conversely, the smaller is the difference between the input signal IN and the feedback signal FB (i.e. the smaller the $|\Delta|$ is), the less is the amount of electric charges needs be added or removed from $C_{PZT}$ during the charge-/discharge-operation, the shorter/narrow the pulse width of the PWM signal should be, and the smaller the PWCC should be.

In another embodiment, the value of PWCC may be inversely related to the length/width of the PWM pulse generated; that is, a larger PWCC is used to generate a shorter/narrower pulse and a smaller PWCC is used to generate a longer/wider pulse. In such a situation, the larger is difference between the input signal IN and the feedback signal FB, the smaller will the PWCC be; and conversely, the smaller is difference between the input signal IN and the feedback signal FB, the larger will the PWCC be. This operation is also feasible as long as the relationship of the pulse width and the PWCC value is monotonic.

The detailed implementations and operations of the DAC 306 and related PWM controller 110 are disclosed in U.S. application Ser. No. 17/380,027, and are thus omitted herein for brevity.

Note that the calculation of PWCCs can be complicated, and thus can be expensive to be performed by the PWM controller 110 in real time. For example, in order to produce a change of $V_{PZT}$, a suitable amount of charges need to be added to, or removed from, via the two terminals of the piezo actuator, shown as the equivalent capacitance $C_{PZT}$ and its terminals $V_{TOP}$ and $V_{BOT}$ in FIG. 2. However, the capacitance $C_{PZT}$ value changes when the applied voltage $V_{PZT}$ changes. Therefore, over continuous swing of the applied voltage $V_{PZT}$ shown in FIG. 2, the capacitance $C_{PZT}$ also changes continuously, such that the quantity of electric charges to added/removed from $C_{PZT}$ to produce a fixed unit change of $V_{PZT}$, such as increasing/reducing 1 mV, will depend on the voltage level of $V_{PZT}$ itself. Another example is battery voltage, shown as $V_{DD}$ in FIG. 1 and FIG. 2, and $V_{DD}$ affects the InFlux PWM pulse width during the charging operation and the DeFlux PWM pulse width during the discharging operation. If $V_{DD}$ is supplied from battery, it will gradually drop along the operation, and this changing $V_{DD}$ cause the pulse widths of two types of PWM mentioned above to also drift along the operation.

In either situations mentioned above, it is desirable to use an LUT to adaptively update the information contained within the PWCC by the results obtained from the present cycle of charge-/discharge-operation, the future operation cycle of the bidirectional circuit 120 can be based on the latest status of the dynamically changing operating condition of amplifier 10. Such adaptive updating of PWCC stored in LUT will not only address fluctuations such as changing battery supply voltage, but also address inaccurately calculated factory default PWCCs due to reasons such as part-to-part tolerance, e.g., it is typical for inductor to have a tolerance of ±10%, parameter drifts due to operating temperature or humidity, etc.

In order to achieve the above objectives: i.e. improve the accuracy of $V_{PZT}$, or minimize $|\Delta|$, by adaptively updating the PWCCs in the LUTs, the present invention provides a method of table learning, where the PWM controller 110 may monitor the feedback signal FB to determine whether the voltage applied to the capacitive load CL (e.g. the $C_{PZT}$ of piezo-speaker PZT) reaches its intended value, and thereby determine whether to adjust/update the PWCC and store the updated PWCC value in the memory 304.

Figure 4:
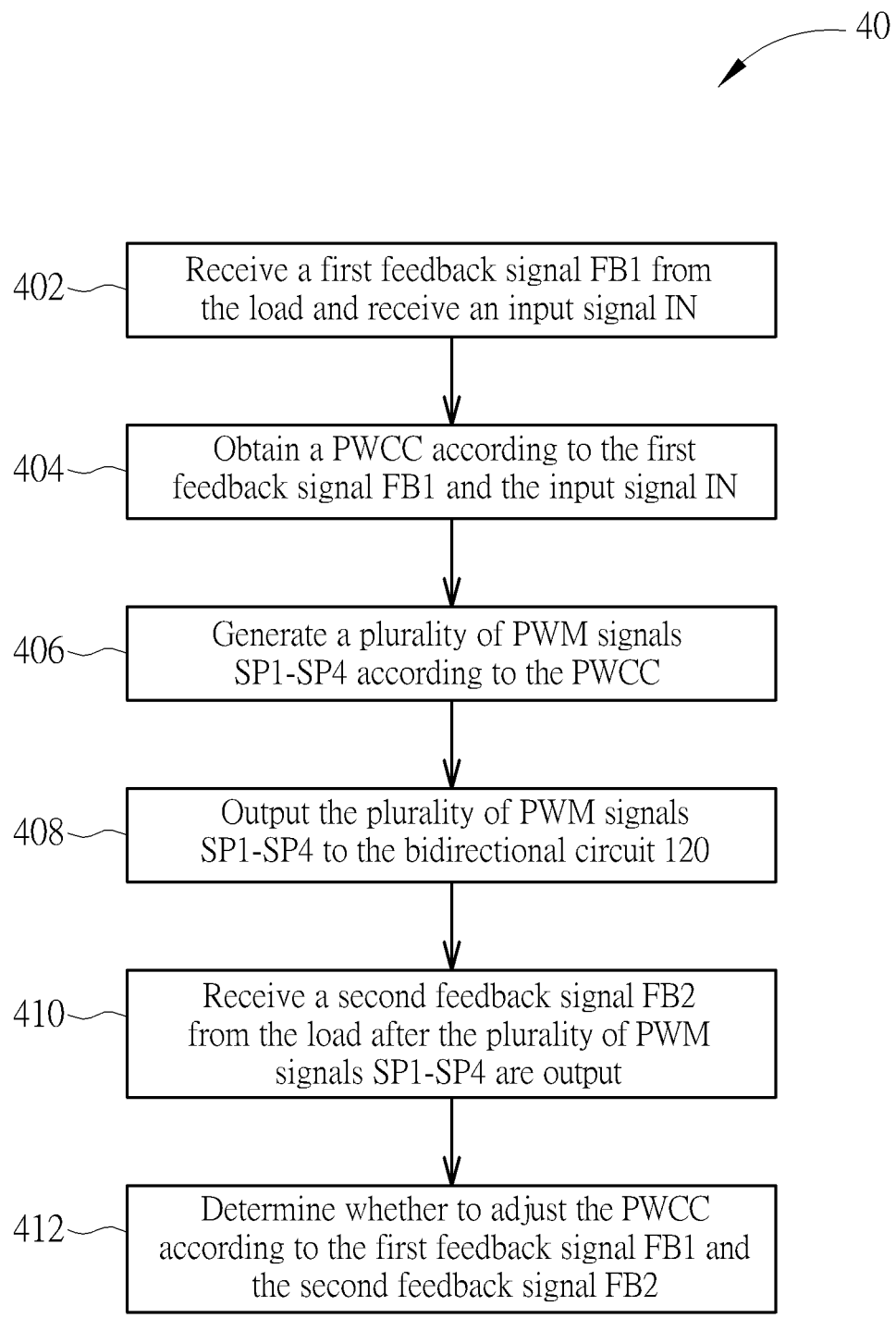
FIG. 4 is a flowchart of a process according to an embodiment of the present invention.

FIG. 4 is a flowchart of a process 40 according to an embodiment of the present invention. The process 40 may be implemented in a PWM controller for controlling a bidirectional circuit to drive a capacitive load, given the PWM controller aims at controlling the bidirectional circuit to perform charging or discharging operation on the capacitive load, such that the voltage across the two terminals of capacitive load $C_{PZT}$ (which may be represented by the feedback signal FB) approaches the input signal IN. As shown in FIG. 4, the process 40 includes the following steps:

Step 402: Receive a first feedback signal FB1 from the load and receive an input signal IN.

Step 404: Obtain a PWCC according to the first feedback signal FB1 and the input signal IN.

Step 406: Generate a plurality of PWM signals SP1-SP4 according to the PWCC.

Step 408: Output the plurality of PWM signals SP1-SP4 to the bidirectional circuit 120.

Step 410: Receive a second feedback signal FB2 from the load after the plurality of PWM signals SP1-SP4 are output.

Step 412: Determine whether to adjust the PWCC according to the first feedback signal FB1 and the second feedback signal FB2.

In Step 402, the PWM controller 110 receives the feedback signal FB1, which reflects a load voltage on the capacitive load at an end of a previous operation cycle (also referred to as a first cycle) and receive the input signal IN corresponding to a present operation cycle.

According to the feedback signal FB1 corresponding to the previous operation cycle and the input signal IN corresponding to the present operation cycle, the PWM controller 110 may determine whether to perform the charging or discharging operation during the present operation cycle (also referred to as a second cycle), according to a difference between the input signal IN and the feedback signal FB1, and further determine to perform memory read operation from either the charging table 304_1 or the discharging table 304_2.

Details of the PWM controller 110 determining to perform the charging or discharging operation are not limited. In an embodiment, the PWM controller may determine the bidirectional circuit 120 to perform the charging operation when the input signal IN is greater than the feedback signal FB1 (e.g., IN-FB1>$\varepsilon_1$, $\varepsilon_1$>0), and determine the bidirectional circuit 120 to perform the discharging operation when the input signal IN is less than the feedback signal FB1 (e.g., IN-FB1<-$\varepsilon_2$, $\varepsilon_2$>0). $\varepsilon_1$ and $\varepsilon_2$ may be the same or different. In addition to determining to perform the charging operation and the discharging operation, in an embodiment, when -$\varepsilon_2$<IN-FB1<$\varepsilon_1$, the PWM controller may determine to perform neither charging nor discharging operation during the present operation cycle, i.e., the mode of a cycle may be "idle" when -$\varepsilon_2$<IN-FB1<$\varepsilon_1$.

Subsequently, in Step 404, the PWM controller 110 may obtain a PWCC according to the feedback signal FB1 and the input signal IN. The PWM controller fetches the PWCC either from the charging table 304_1 or from the discharging table 304_2 stored in the memory 304, based on which operation to perform.

The LUT of the present invention, either the charging table 304_1 or the discharging table 304_2, may be in form of, or comprise, a two-dimensional (2D) array. FIG. 5 illustrates a part of an exemplary LUT according to an embodiment of the present invention. For brevity, only the first 7 columns and rows 29-36 of the LUT are illustrated in FIG. 5.

PWCCs stored in a particular column are for generating PWM signals controlling the bidirectional circuit 120 to produce a particular intended voltage change on the capacitive load CL under different operating points. Suppose that the LUT illustrated in FIG. 5 represents the charging table, the PWCC stored in the n-th column is configured for generating PWM signals to perform the charging operation and to achieve an increment of n×$\Delta V_U$ on the capacitive load, where $\Delta V_U$ may be a unit of voltage change, such as 0.73 mV. That is, the PWCCs in the 1$^{st}$ column are for generating PWM signals to perform the charging operation and to achieve an increment of 1×$\Delta V_U$ on the load CL, while the PWCCs in the 2$^{nd}$ column are for generating PWM signals to achieve an increment of 2×$\Delta V_U$ on the load CL, and so on and so forth. Similarly, suppose that the LUT illustrated in FIG. 5 represents the discharging table, the PWCC stored in the n-th column are configured for generating PWM signals to perform the discharging operation and to achieve a decrement of n×$\Delta V_U$ of the load CL. The determination of $\Delta V_U$ will be elaborated later on.

The PWCCs stored in the same column can be view as a collection of different PWM pulse widths to address different operating points. A operating point may be defined by factors such as the voltage applied across L1 during the InFlux operation (to transfer electrical energy into magnetic energy in inductor L1) and the DeFlux operation (to transfer magnetic energy of inductor L1 back to electrical energy); the value of $C_{PZT}$ at a specific $V_{PZT}$ voltage level; the voltage levels of $V_{DD}$, $V_{TOG}$, $V_{MV}$ during the operation of the current cycle, etc. It is due to factors/variations such as these that the pulse widths for PWM signals S1~S4 need to be optimized for each operating point in order to control the operation of the bidirectional circuit 120 to produce the same intended voltage change across the load CL consistently.

In short, the LUT may be in form of 2D array as shown FIG. 5. One dimension of the LUT (e.g., the column of the LUT) contains PWCCs which vary in response to the various factors of different operating points so as to achieve consistent voltage changes across the load CL under different operating points; the other dimension of the LUT (e.g., one particular row of the LUT) contains PWCCs to produce, under one particular operating point, voltage changes of different magnitudes across the load CL, where the magnitudes of the voltage changes may be an integer multiple of a unit size, such as n×$\Delta V_U$.

Note that, since the capacitance $C_{PZT}$ varies with respect to the applied voltage $V_{PZT}$, where the applied voltage $V_{PZT}$ may be represented by the feedback signal or be approximated by the input signal, the PWCCs stored in one column of LUT (read as first sub-array along first dimension of 2D array recited in claims) are corresponding to different levels of load voltage $V_{PZT}$ or corresponding to different levels of input signal IN. Similarly, the PWCCs stored in one row of LUT (read as second sub-array along second dimension of 2D array recited in claims) are corresponding to a certain level of input signal IN or a certain level of load voltage or feedback signal FB.

In this embodiment/regard, each entry of the LUT may be fetched by referring to a 2D address (n1, n2) with the indices n1 and n2. The index n1 may indicate a present level of the input signal IN (or the feedback signal FB/FB1). The index n2 may indicate a voltage change expected to be reached in the present/coming operation cycle, and this voltage change corresponds to the difference value of the input signal IN and the feedback signal FB.

The expected/intended voltage change/difference may be quantized as an integer multiple of $\Delta V$, which means $\Delta V$ may be regarded as a step size for the charging or discharging operation (where $\Delta V$ and $\Delta V_U$ are used interchangeably in the present application). That is, in an embodiment, an intended voltage difference on the capacitive load caused by the charging or discharging operation is an integer multiple of step size $\Delta V$. The value of $\Delta V$ may be determined in any appropriate manner. In an embodiment, under a scenario of representing the load voltage $V_{PZT}$ into an N-bit digital signal, $\Delta V$ may be calculated as:

$$\Delta V = \frac{V_{pp}}{2^N} \text{ or } \Delta V = \frac{V_{pp}}{2^N - 1}. \quad \text{(eq. 1)}$$

Herein $V_{pp}$ represents a peak-to-peak voltage of the capacitive load or a voltage range of the load voltage. In an exemplary embodiment, when the peak-to-peak voltage $V_{pp}$ equals 30V and $V_{PZT}$ may be represented as an 8-bit system, and the delta voltage $\Delta V$ may be equal to $$\Delta V = \frac{V_{pp}}{2^N - 1} = \frac{30 \text{ V}}{2^8 - 1} \cong 117.6 \text{ mV}.$$

In an embodiment, the index n2 may be obtained by calculating a difference between the input signal IN and the feedback signal FB1 first, and then obtaining/extracting an informative integer as the index n2 according to the difference calculated previously.

In an embodiment, the difference (value) of the input signal IN and the feedback signal FB1 may be mathematically expressed as:

$$\text{Diff}_k = \text{abs}(IN_k) - \text{abs}(FB_{k-1}) \quad \text{(eq. 2)}.$$

where $\text{Diff}_k$ is/represents the difference value corresponding to the operation cycle k, abs( ) represents the absolute-value-taking operation which outputs an absolute value or a magnitude thereof, and indices k and k−1 are temporal cycle indices which refer to the present operation cycle and the previous operation cycle, respectively. Herein, $FB_{k−1}$ represents FB1 corresponding to the previous operation cycle mentioned above. In eq. 2, existence of the absolute-value operation is to properly assess how much charges have been stored in the capacitive load CL/$C_{PZT}$ (regardless polarities of the load voltage $V_{PZT}$), so that decision of whether to perform the charging or discharging operation can be appropriately made. It can be viewed that absolute value operation in the eq. 1 is for removing the effect brought by polarities of $IN_k$ and $FB_{k−1}$, where the effect of the polarities of $IN_k$ and $FB_{k−1}$ would be added back via the toggling switches SW1 and SW2 in the single-ended to differential converter 200 shown in FIG. 2. In an embodiment, both the input signal IN/$IN_k$ and the feedback signal FB1/$FB_{k−1}$ are digital, and thus the difference Diff/$\text{Diff}_k$ is digital as well.

After the difference value $\text{Diff}_k$ is calculated, in an embodiment, the index n2 may be further calculated, which may be mathematically expressed as:

$$n2 = \text{floor}\left(\frac{\text{abs}(\text{Diff}_k)}{2^{(B_{diff} - B2)}}\right). \quad \text{(eq. 3a)}$$

In eq. 3a, B_diff refers to the bit count of the difference value Diff/$\text{Diff}_k$, assuming that the difference value Diff is a B_diff-bit digital signal. In addition, step size among the second dimensional of LUT, denoted as $\Delta V$ or $STP_2$, may be expressed as $\Delta V = V_{pp}/2^{B2} = STP_2$, where B2 is related to the charging/discharging resolution provided by the LUT. In other words, the index n2 is obtained by taking the most significant B2 bits of the magnitude (or absolute value) of the difference value Diff/$\text{Diff}_k$. In an exemplary embodiment, the difference value $Diff/Diff_k$ is a 24-bit signal (B_diff=24), and the LUT may achieve 12-bit resolution (B2=12) by adopting $\Delta V$ as $\Delta V=STP_2=V_{pp}/2^{12}$, hence, the index n2 may be calculated by taking the most significant 12 bits (12=B_diff−B2) of abs(Diff). Herein, notations $\Delta V$ and $STP_2$ are used interchangeably, and notations N and B2 are used interchangeably as well.

In another embodiment, another expression of the index n2 may be expressed as:

$$n2 = \text{round}\left(\frac{\text{abs}(Diff_k)}{STP_2}\right); \quad \text{(eq. 3b)}$$

where the round function rounds the number to a nearest integer.

Illustratively, FIG. 5 demonstrates an excerpt of the LUT recording the PWCCs corresponding to several values of the indices n1 and n2, where the index n1 is the row index and the index n2 is the column index. According to the difference value of the input signal IN and the feedback signal FB, the PWM controller 110 may determine the number of delta voltage $\Delta V$ to be achieved in this operation cycle, e.g., 1×$\Delta V$, 2×$\Delta V$ . . . 7×$\Delta V$, so as to determine the index n2 and fetch the PWCC from the selected column.

Please note that, detail operation(s) of obtaining/extracting the informative integer as the index n2 according to the difference $Diff/Diff_k$ are not limited. As long as relationship between n2 and $Diff_k$ can be expressed by eq. 3a and eq. 3b, requirements of the present invention are satisfied, and it shall be within the scope of present invention.

On the other hand, the index n1 may indicate the present level of the input signal IN or the feedback signal FB; hence, according to the received input signal IN or feedback signal FB, the PWM controller 110 may determine the index n1 and fetch the PWCC from the selected row. As mentioned above, the feedback signal FB may be generated from the differential voltage VoP-VoN of the single-ended to differential converter 200, which is equivalent to the voltage $V_{PZT}$ of the piezo-speaker PZT. In a preferable embodiment, the input signal IN is applied to determine the index n1, where the stability of the energy recycling system may be improved. Note that the feedback signal FB may approach the input signal IN finally; hence, applying the input signal IN to determine the index n1 may also achieve equivalent result.

In an embodiment, the index n1 may be expressed as:

$$n1 = \text{floor}\left(\frac{IN}{2^{B\_in-B_1}}\right) + 2^{B_1-1} + 1; \quad \text{(eq. 4a)}$$

where the floor function takes the integer part of the number, B_in refers to the bit count of the input signal IN (i.e., the input signal IN is a B_in-bit digital signal), and B1 is related to a number of levels used to represent the input signal IN. In an embodiment, the LUT may include $2^{B1}$ rows, and the total range of the input signal IN may be divided with a step value to have $2^{B1}$ levels. Therefore, the index n1 is obtained via taking/extracting the most significant B1 bits of the input signal IN. In an exemplary embodiment, the input signal IN is a 24-bit signal, and the index n1 is a 6-bit value that defines 64 levels of the input signal IN; hence, the index n1 may be obtained via taking the most significant 6 bits of the input signal IN. As a result, the index n1 may reflect the level of the input signal IN, so as to determine the level of the feedback signal FB as the feedback signal FB approaches the input signal IN.

Note that the value $2^{B1-1}+1$ is optionally included in the calculation of the index n1. In an embodiment when the input signal IN is already biased which is always positive, the value $2^{B1-1}+1$ will not be required, and the index n1 may be expressed as:

$$n1 = \text{floor}\left(\frac{IN}{2^{B\_in-B_1}}\right). \quad \text{(eq. 4b)}$$

Another expression of the index n1 may be expressed as:

$$n1 = \text{floor}\left(\frac{IN}{STP_1}\right); \text{ or} \quad \text{(eq. 4b)}$$

$$n1 = \text{floor}\left(\frac{IN}{STP_1}\right) + 2^{B_1-1} + 1; \quad \text{(eq. 4b)}$$

where $STP_1$, the voltage step size of the index n1, is equal to $V_{pp}/2^{B1}$. In some embodiments, the floor function used in the above equations may be replaced by the round function, which is not limited thereto.

Similarly, detail operation(s) of obtaining/extracting the informative integer as the index n1 according to the input signal IN are not limited. As long as relationship between n1 and IN can be expressed by one of eq. 4a-4b, requirements of the present invention are satisfied, and it is within the scope of present invention.

Based on the indices n1 and n2 which are obtained according to the feedback signal FB1 and the input signal IN, the PWM controller may fetch the PWCC accordingly.

In Step 406 and Step 408, the PWM controller generates the PWM signals SP1-SP4 according to the fetched PWCC and output the generated PWM signals SP1-SP4 to the bidirectional circuit 120.

The bidirectional circuit 120 then would perform the charging operation or the discharging operation according to the PWM signals SP1-SP4 generated in Step 408.

In Step 410, after the charging operation or the discharging operation according to the PWM signals SP1-SP4 is accomplished (or at an end of the present operation cycle), the PWM controller 110 may further receive the feedback signal FB2, which is corresponding to the present operation cycle.

In an embodiment, the feedback signal $FB1/FB_{k-1}$ may represent the load voltage $V_{PZT}$ (regardless of $V_{BIAS}$) at an end of the previous operation cycle (e.g., operation cycle k−1). During the present operation cycle, the bidirectional circuit performs charging or discharging operation based on PWCC obtained according to the feedback signal FB1 and produces a voltage change on the load voltage $V_{PZT}$. At an end of the present operation cycle (e.g., operation cycle k), the load voltage $V_{PZT}$ may be observed as the feedback signal $FB2/FB_k$ (regardless of $V_{BIAS}$) Details of Steps 402-410 may further be referred to U.S. Pat. No. 11,271,480, which are not narrated herein for brevity.

In Step 412, the PWM controller 110 may determine whether to or how to adjust the PWCC according to the feedback signals FB1 and FB2. After the feedback signal FB2 is received, the controller 110 may further determine the actual voltage difference. If the actual voltage difference is not equal to or significantly deviated from the intended voltage difference, the PWCC may need to be adjusted according to the feedback signals FB1 and FB2. Once the PWCC is updated, the updated PWCC would be written (i.e., saved) back to the address (n1, n2), from which the original PWCC is fetched in Step 404, of the LUT within the memory.

Figure 6:
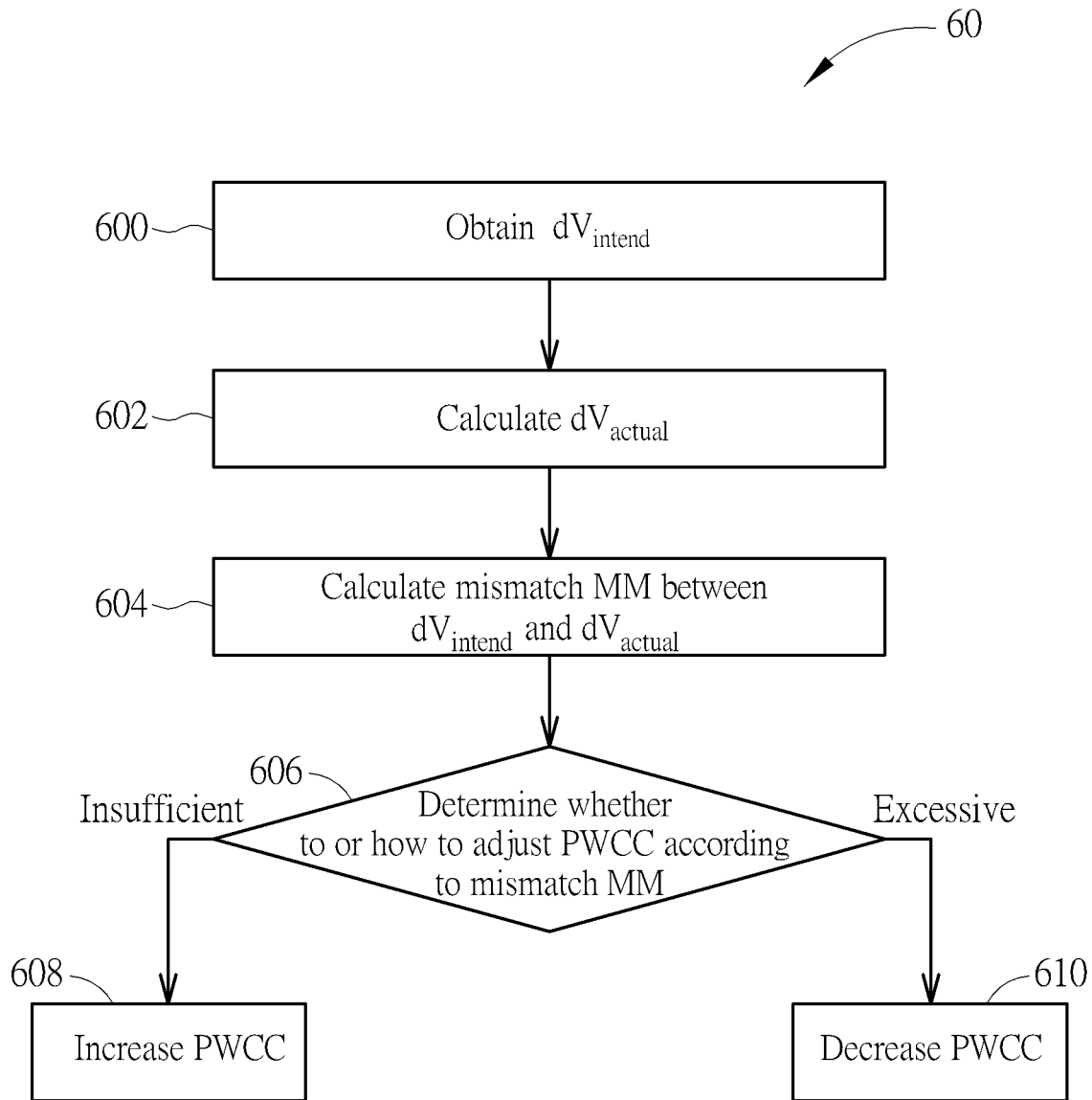
FIG. 6 is a flowchart of a table learning process according to an embodiment of the present invention.

FIG. 6 is a flowchart of a table learning process 60 according to an embodiment of the present invention. The table learning process 60 may be implemented in a PWM controller such as 110 and may be regarded as a detail of Step 412. As shown in FIG. 6, the table learning process 60 includes the following steps:

Step 600: Obtain an intended voltage difference $dV_{intend}$.

Step 602: Calculate an actual voltage difference $dV_{actual}$.

Step 604: Calculate a mismatch MM between the intended voltage difference $dV_{intend}$ and the actual voltage difference $dV_{actual}$.

Step 606: Determine whether to or how to adjust the PWCC according to the mismatch MM.

Step 608: Increase the PWCC.

Step 610: Decrease the PWCC.

In Step 600, the PWM controller 110 may obtain the intended voltage difference $dV_{intend}$ via obtain the index n2. The intended voltage difference $dV_{intend}$ is the intended voltage change on the load voltage $V_{PZT}$ which is expected to be produced via the charging or discharging operation using the PWCC during the present operation cycle.

In an embodiment, the intended voltage difference $dV_{intend}$ may be obtained as $n2 \times \Delta V$ when the charging operation is performed, and be obtained as $(-1) \times n2 \times \Delta V$ when the discharging operation is performed. The intended voltage difference $dV_{intend}$ may be viewed as a target voltage change expected to be achieved via the charging or discharging operation during the present operation cycle according to the PWCC obtained in Step 404.

After the feedback signal FB2 of the present operation cycle is received, in Step 602, the PWM controller 110 may calculate the actual voltage difference $dV_{actual}$ as a difference between the feedback signal FB2 of the present operation cycle and the feedback signal FB1 of the previous operation cycle, e.g., $dV_{actual}=FB2-FB1$. The actual voltage difference $dV_{actual}$ reflects the actual voltage change on the load voltage $V_{PZT}$ which is actually produced via the charging or discharging operation using the PWCC during the present operation cycle.

By comparing the intended voltage difference $dV_{intend}$ with the actual voltage difference $dV_{actual}$, whether the PWCC is accurate or how accurate the PWCC is can be determined. In Step 604, the PWM controller 110 may calculate the mismatch MM between the intended voltage difference $dV_{intend}$ and the actual voltage difference $dV_{actual}$. In an embodiment, the PWM controller may calculate the mismatch MM as:

$$MM = dV_{actual} - dV_{intend};$$

where the mismatch MM, in the current embodiment, is equal to the actual voltage difference $dV_{actual}$ minus the intended voltage difference $dV_{intend}$.

In Step 606, the PWM controller 110 thereby determines whether to adjust the PWCC or how to adjust the PWCC according to the mismatch MM. If the mismatch MM indicates that the charging or discharging operation performed by the bidirectional circuit is insufficient, the PWM controller may increase the PWCC (Step 608) and store the increased PWCC back into the memory 304. On the other hand, if the mismatch MM indicates that the charging or discharging operation performed by the bidirectional circuit is excessive, the PWM controller 110 may decrease the PWCC (Step 610) and store the decreased PWCC back into the memory 304. Otherwise, if the mismatch MM indicates that the charging or discharging operation performed by the bidirectional circuit is neither insufficient nor excessive, the PWM controller may determine not to adjust/update the PWCC.

Details of determining whether the charging or discharging operation is insufficient or excessive according to the mismatch MM in Step 606 are not limited. For example, suppose the charging operation is performed, meaning $dV_{intend}>0$ and $dV_{actual}>0$, the PWM controller 110 may determine the charging operation is insufficient if MM<0 or MM<−TH2 (for TH2>0); and determine the charging operation is excessive if MM>0 or MM>TH1 (for TH1>0). Herein, $dV_{intend}$ and $dV_{actual}$ may be interpreted as intended voltage increment and actual voltage increment, respectively, under the charging operation/circumstance (where voltage increment represents an amount of increment in voltage).

On the other hand, suppose the discharging operation is performed, meaning $dV_{intend}<0$ and $dV_{actual}<0$, the PWM controller 110 may determine the discharging operation is insufficient if MM>0 or MM>TH3 (for TH3>0); and determine the charging operation is excessive if MM<0 or MM<−TH4 (for TH4>0). Since $dV_{intend}/dV_{actual}$ is by itself negative when discharging is performed, voltage decrement (where voltage decrement represents an amount of decrement/reduction in voltage) can be expressed by $(-1) \times dV_{intend}$ and $(-1) \times dV_{actual}$ under the discharging operation. Hence, $(-1) \times dV_{intend}$ and $(-1) \times dV_{actual}$ may be interpreted as intended voltage decrement and actual voltage decrement, respectively, under the discharging operation/circumstance.

Note that, threshold(s) for determining whether the (dis)charging operation is insufficient or excessive, e.g., TH1-TH4, may be chosen according to practical situation and not limited to any specific value(s).

Figure 7:
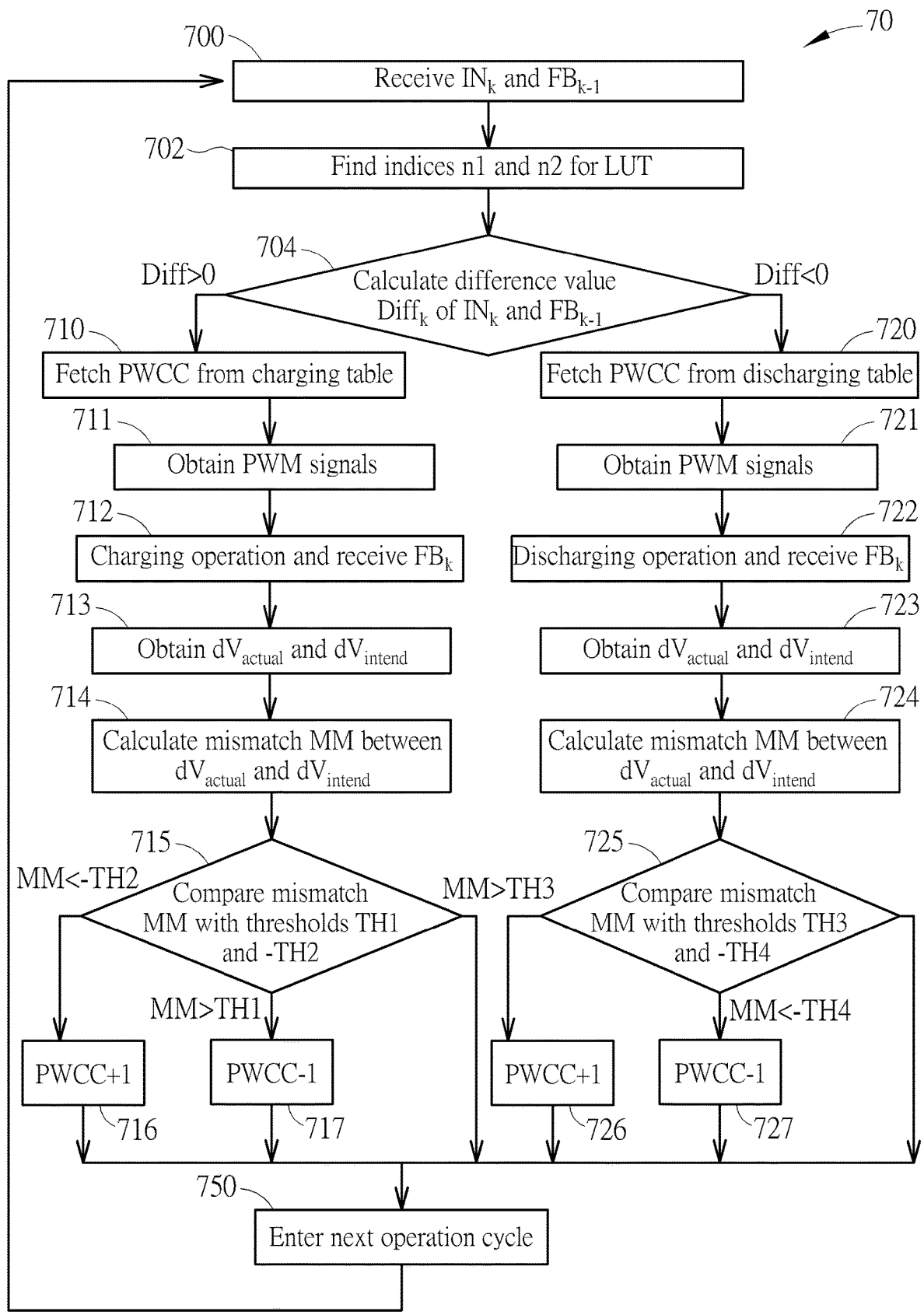
FIG. 7 is a flowchart of a detailed table learning process according to an embodiment of the present invention.

The abovementioned table learning operations along with the driving operations may be regarded as a feedback control mechanism and further be detailed as a detailed table learning process 70, as shown in FIG. 7 (where subscript k in FIG. 7 represents operation cycle index). The detailed table learning process 70 includes the following steps:

Step 700: Receive the input signal $IN_k$ and the feedback signal $FB_{k-1}$.

Step 702: Find the indices n1 and n2 for the LUT.

Step 704: Calculate the difference value $Diff_k$ of the input signal $IN_k$ and the feedback signal $FB_{k-1}$. If the difference value Diff is greater than 0, then go to Step 710; if the difference value Diff is smaller than 0, then go to Step 720.

Step 710: Fetch a PWCC from the charging table 304_1 according to the address (n1, n2).

Step 711: Obtain the PWM signals according to the PWCC.

Step 712: Perform the charging operation and receive the feedback signal $FB_k$.

Step 713: Obtain the actual voltage difference $dV_{actual}$ and the intended voltage difference $dV_{intend}$.

Step 714: Calculate the mismatch MINI between the actual voltage difference $dV_{actual}$ and the intended voltage difference $dV_{intend}$.

Step 715: Compare the mismatch MINI with thresholds TH1 and −TH2. If the mismatch MM is smaller than the threshold −TH2, then go to Step 716; if the mismatch MM is greater than the threshold TH1, then go to Step 717.

Step 716: Increase the PWCC by 1.
Step 717: Decrease the PWCC by 1.
Step 720: Fetch a PWCC from the discharging table 304_2 according to the address (n1, n2).
Step 721: Obtain the PWM signals according to the PWCC.
Step 722: Perform the discharging operation and receive the feedback signal $FB_k$.
Step 723: Obtain the actual voltage difference $dV_{actual}$ and the intended voltage difference $dV_{intend}$.
Step 724: Calculate the mismatch MINI between the actual voltage difference $dV_{actual}$ and the intended voltage difference $dV_{intend}$.
Step 725: Compare the mismatch MINI with thresholds TH3 and −TH4. If the mismatch MM is greater than the threshold TH3, then go to Step 726; if the mismatch MM is smaller than the threshold −TH4, then go to Step 727.
Step 726: Increase the PWCC by 1.
Step 727: Decrease the PWCC by 1.
Step 750: Enter the next operation cycle and return to Step 700.

According to the detailed table learning process 70, the PWM controller 110 may determine whether to perform charging or discharging according to whether the difference value Diff is a positive value or a negative value, and correspondingly fetch the PWCC in the charging table 304_1 or the discharging table 304_2. In the table learning operations, the PWCC may be increased or decreased according to the comparison with threshold values under the charging or discharging operations. For example, in the charging phase, the actual voltage difference $dV_{actual}$ and the intended voltage difference $dV_{intend}$ may be positive values; hence, a larger mismatch MM indicates that the charging is excessive and a smaller mismatch MINI indicates that the charging is insufficient. The mismatch MINI is compared with the thresholds TH1 and −TH2. Therefore, an insufficient charging is determined and the PWCC should be increased by 1 if the mismatch MINI is smaller than the threshold −TH2, which may be a negative value or 0; and an excessive charging is determined and the PWCC should be decreased by 1 if the mismatch MM is greater than the threshold TH1, which may be a positive value or 0. The values of TH1 and TH2 may be the same or different.

On the other hand, in the discharging phase, the actual voltage difference $dV_{actual}$ and the intended voltage difference $dV_{intend}$ may be negative values; hence, a larger mismatch MM indicates that the discharging is insufficient, and a smaller mismatch MM indicates that the discharging is excessive. The mismatch MM is compared with the thresholds TH3 and −TH4. Therefore, an insufficient discharging is determined and the PWCC should be increased by 1 if the mismatch MM is greater than the threshold TH3, which may be a positive value or 0; and an excessive discharging is determined and the PWCC should be decreased by 1 if the mismatch MM is smaller than the threshold −TH4, which may be a negative value or 0. The values of TH3 and TH4 may be the same or different.

In other words, Step 716 represents the PWCC is increased when the actual voltage increment is less than the intended voltage increment; Step 717 represents the PWCC is decreased when the actual voltage increment is greater than the intended voltage increment; Step 726 represents the PWCC is increased when the actual voltage decrement is less than the intended voltage decrement; Step 727 represents the PWCC is decreased when the actual voltage decrement is greater than the intended voltage decrement.

In addition, in this embodiment, the PWCC is increased or decreased by 1 in each operation cycle, which is not limited thereto. In another embodiment, the PWCC may be adjusted (increased or decreased) in any appropriate manner, such as by a level determined based on the value of the mismatch MM. For example, the PWCC may be adjusted by more than 1 if the mismatch MM is farther larger than or farther smaller than the corresponding threshold. As long as the PWCC is fetched from the memory, updated and written back to the memory, requirements of the present invention are satisfied, and it shall be within the scope of present invention.

Further, the PWCC updating operation shown in the detailed table learning process 70 may be performed every operation cycle. Those skilled in the art should understand that the present invention is not limited thereto. For example, in an embodiment, the table learning operations may be performed in any constant or variable frequency, e.g., performed once every 3 or 5 operation cycles. In another embodiment, the table learning functions may be enabled in a specific period and then disabled, where the enabling time may be predetermined.

Please also note that several steps of the detailed table learning process 70 are interchangeable. For example, the operations of finding the indices n1 and n2 in Step 702 and calculating the difference value Diff in Step 704 may be interchanged; that is, the difference value Diff may be calculated before the indices n1 and n2 for the LUT are found, or these two steps may be performed simultaneously. This will not influence the effects achieved by the detailed table learning process 70.

In another perspective, PWCCs arranged as 2D array as FIG. 5 show functions as an example. Those skilled in the art may make modification(s) and alteration(s) accordingly. For example, the PWCCs originally arranged as 2D array may be stacked (or even permuted) as a long one-dimensional array and stored in an LUT in the memory, which is also within the scope of the present invention.

Figure 8:
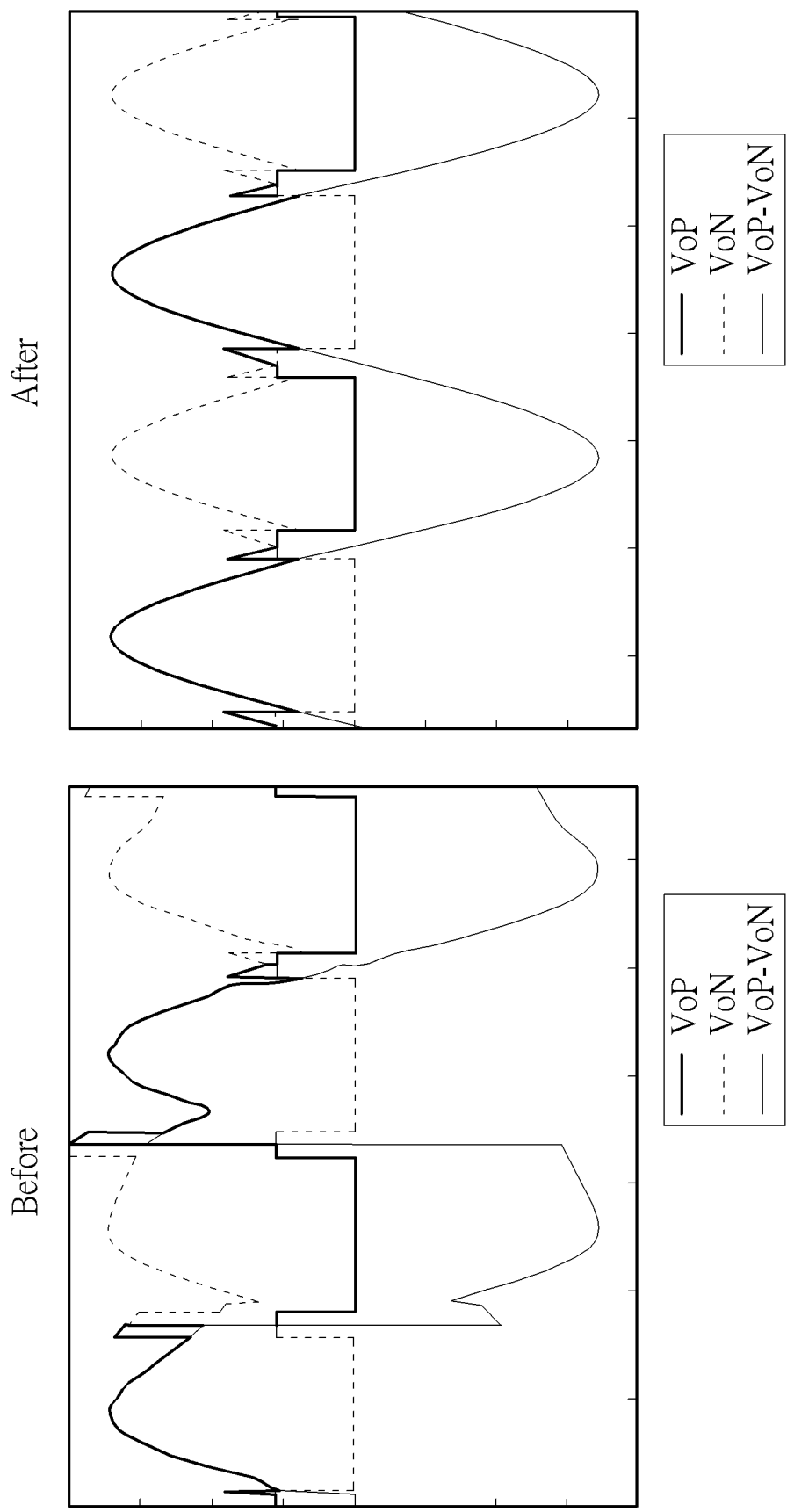
FIG. 8 illustrates a simulation result of the waveforms of the output voltages generated by the bidirectional circuit before and after the table learning process.

FIG. 8 illustrates a simulation result of the waveforms of the output voltages generated by the bidirectional circuit 120 before and after the table learning process, where the differential voltages VoP and VoN and their subtraction VoP-VoN are shown. In the simulation shown in FIG. 8, the input signal IN is a single tone signal with sinusoidal waveform. As shown in left portion of FIG. 8, before the table learning process is performed (or without the table learning), the waveforms are highly distorted and rough and irregular, such that the sound signals may include significant distortions. In contrast, after the table learning process is performed, as shown in right portion of FIG. 8, the waveforms become smooth sinusoidal signals; this means that the sound quality is significantly improved by applying the table learning process.

In addition, there are some imperfections on the DAC within PWM controller (with circuit topology disclosed in U.S. Pat. No. 11,271,480) which breaks the monotonicity of DAC in practice. Table learning process/operations may also be able to eliminate those imperfections as well.

The table learning method provided in the present invention may be implemented in suitable manner. In the above embodiments, the table learning operation is implemented in the PWM controller 110 of the driving circuit 10, and more specifically, in the control circuit 302 of the PWM controller 110, where the control circuit 302 may be realized as an integrated circuit (IC). Therefore, the table learning operation may be implemented as an application specific integrated circuit (ASIC) which is included in the control circuit 302. In such a situation, the computations for realizing the table learning may be implemented by using comparators, adders, and/or subtractors of the IC. Alternatively or additionally, the table learning method may include software algorithms which are implemented in a processing circuit such as a microprocessor, microcontroller unit, or the like, where the control circuit 302 of the PWM controller 110 may be considered as a component of the processing circuit.

Please also note that, in the above embodiments, the control circuit 302 may be a circuit which performs the table learning operation. In an embodiment, the control circuit 302 may be a digital circuit and the input signal IN and the feedback signal FB processed by the control circuit 302 are digital signals.

U.S. application Ser. Nos. 18/048,852 and 18/177,765 disclosed a table learning algorithm which can adapt PWCC, pulse width control code, against various operating conditions which are either observable or non-observable. The operation conditions may be battery voltage (might be weaken as time goes by), parameter variation/drift of electric component (e.g., capacitance, inductance, or resistance thereof). It is shown that with table learning algorithm realized within an audio amplifier, THD (total harmonic distortion) is reduced and sound quality is enhanced significantly.

As stated earlier, table learning operation, involving memory write and ADC readout, may be performed every operation cycle. The operation cycle herein may be referred as ADC cycle, which is a reciprocal of ADC rate/frequency, where ADC cycle/rate/frequency is further elaborated in U.S. application Ser. No. 18/051,015, which is incorporated herein by reference. In the following description or under the context of lowering table learning frequency, the table learning operation may refer to one iteration, from step 700 and before step 750, of the process 70, which involves at least one ADC readout and one memory write.

However, after the table is stable, it is not necessary to update table/PWCC such frequently. It is because battery voltage and circuit parameter drift vary slowly, compared to ADC frequency.

In the present application, table being stable/converged means that there is no need to update table entry for a certain period of time. For example, if the mismatch MM is within a range of −TH2<MM<TH1 or within a range of −TH4<MM<TH3, there is no need to update table entry. Furthermore, table being stable also means that table entry remains within a small range for a long period of time. For example, when the table learning operation performs PWCC=PWCC+1, then performs PWCC=PWCC−1, then performs PWCC=PWCC+1, then performs PWCC=PWCC−1, and so on and so forth. In this case, the table may also be considered as stable/converged.

In this regard, power consumption can be reduced by lowering the table learning frequency, which means that, instead of performing L times of table/PWCC update within L ADC cycles, only m times of table/PWCC update is performed out of L ADC cycles, where m<L. The m times of table/PWCC update may be uniformly or non-uniformly distributed over the L ADC cycles, depending on practical requirement. By doing so, at least (L-m) times of memory write operation within L ADC cycles are spared. Moreover, for the system where (DC-DC) operation doesn't rely on ADC results, (L-m) times of ADC are further avoided.

For example, a learn-1-skip-k fashion may be adopted, meaning that after performing one table learning operation in one operation cycle, table learning operation may be skipped for the next/consecutive k operation cycles. Herein (which means in the following description or under the context of lowering table learning frequency), k refers to number of skipped operation cycle(s), which may be next/consecutive to the table learning operation cycle in which table learning operation is performed.

In an embodiment, number of skipped operation cycle k may be certain constant, or be constant over a period of time. For example, k=0 for a learning period (e.g., 5 minutes) and k=K after the learning period, where K is some constant such as 15, 60, etc., but not limited thereto. Learning period may be referred to a time interval during which the table learning operation is performed frequently, e.g., performed every operation cycle or performed at a rate of ADC rate. Learning period may be referred to a time interval during which the table has not converged to a stable status.

In an embodiment, number of skipped operation cycle k may be determined adaptively, preferably after the table is stabilized. For example, k may be increased when table error decreases and/or k may be decreased when table error increases. A list of predetermined k, e.g., {7, 17, 35, 60}, may be prepared in advance. When the table error decreases/increases, a larger/smaller k may be chosen from the list, but not limited thereto. Table error refers to an indication of whether (some entry of) the table shall be updated. For example, when the table error is sufficiently large, (some entry of) the table shall be updated. Under the context of the driving circuit 10 (where the bidirectional circuit 120 or driving circuitry comprising bidirectional circuit 120 may be called as Class-X amplifier) as an example, table error may be referred to $|dV_{intend} - dV_{actual}|$ or a statistic thereof, where $dV_{intend}/dV_{actual}$ is voltage difference the PWCC intended/actually achieved. In an embodiment, k may be a (pseudo-)random number, preferably after the table is stabilized.

In an embodiment, k may be a (pseudo-)random number or (pseudo-)randomly selected from a list comprising (pseudo-)random numbers, e.g., {12, 19, 35, 68}, but not limited thereto, so as to break up any potential noise due associated with the frequency of table learning event.

It is not limited to exploiting the learn-1-skip-k fashion. For example, system may operate in a scenario where non-learning or (table-learning-)skipping periods interlace between learning periods. Lengths of learning periods, denoted as $L_{lm}$, may (or may not) be the same. Lengths of non-learning or skipping periods, denoted as $L_{skip}$, may be determined/adapted according to, for example, table error. Length of skipping periods may increase/decrease as table error decrease/increase.

A scenario of skipping duty as 6%, 50%, 75% is simulated, where the skipping duty may be expressed as $(L_{skip}/(L_{skip}+L_{lm}))$, where $L_{skip}/L_{lm}$ denotes the skipping/learning period. Results show that the THD and (rms of) idle noise performance for skipping duty as 6%, 50%, 75% are more or less the same. It implies that skipping more the table learning operation has almost no harm on (THD and idle noise) performance.

Another experiment/simulation compares spectrum of $V_{PZT}$ (the driving circuit output) for two cases. First case is under extensive learning (performing table learning operation on every ADC cycle) after the table is stable. Second case is under completely no learning (i.e., no table update or memory write) after the table is stable. The data of $V_{PZT}$ for computing the spectrum is collected about a certain period of time, e.g., 0.3 second (corresponding to 256,000 samples), after the table is stable, results show that, first case can achieve SNDR (signal-to-noise-plus-distortion ratio) as 69.56 dB when input signal level is −25 dBFS (FS stands for full scale), while second case can achieve SNDR as 69.44 dB when input signal level is −25 dBFS. It implies that k/L$_{skip}$ may be enlarged/lengthened for lowering power consumption, without affecting SNDR or THD performance significantly.

Figure 9:
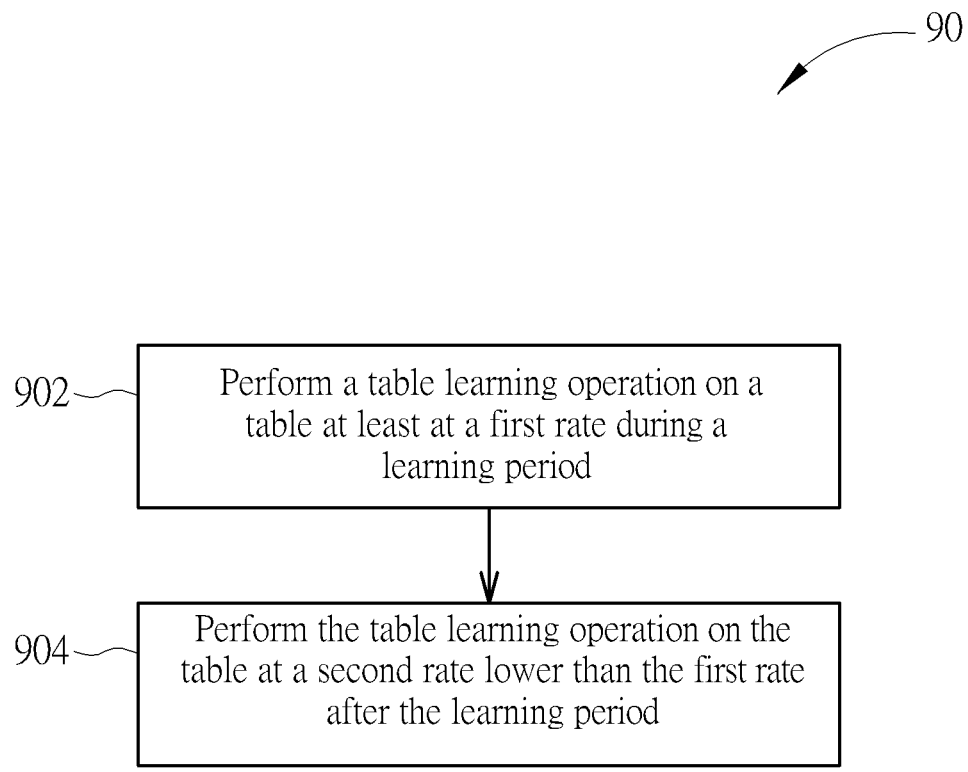
FIG. 9 is a flowchart of a process according to an embodiment of the present invention.

Operations of lowering table learning frequency may be summarized as a process 90. The process 90 may be performed by a controller. As shown in FIG. 9, the process 90 includes the following steps:

Step 902: Perform a table learning operation on a table at least at a first rate during a learning period.

Step 904: Perform the table learning operation on the table at a second rate lower than the first rate after the learning period.

In an embodiment, the table in the process 90 may be referred to the charging table 304_1 or the discharging table 304_2, which is not limited thereto. In an embodiment, the first rate may be referred/corresponding to the ADC rate, which is not limited thereto. In an embodiment, the learning period may be referred to a period of time during which the table has not been stable/converged and the table learning operation is performed extensively (e.g., at least at the first rate), which is not limited thereto. The first rate may be viewed as a minimum rate at which the table learning operation is performed (during the learning period). In an embodiment, the controller may determine whether the table is stable, and the learning period may be determined according to a result of whether the table is stable, which is not limited thereto. In an embodiment, the controller performing the process 90 may be the PWM controller, which is not limited thereto.

As long as the table learning operation is performed less frequently (in order to reduce power consumption) after the table is stable/converged, requirement of the present invention is satisfied, which is within the scope of the present invention.

Figure 10:
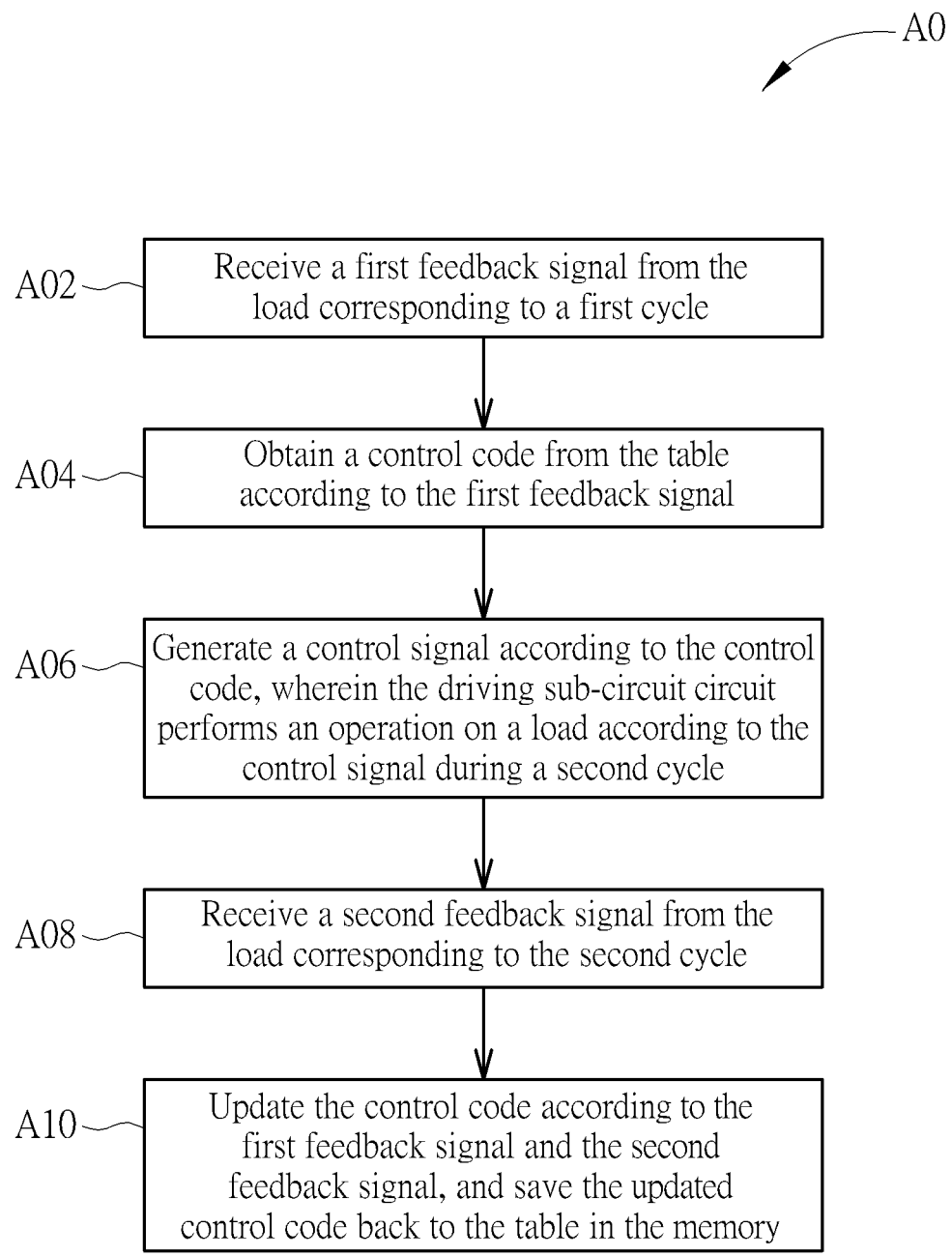
FIG. 10 is a flowchart of a process according to an embodiment of the present invention.

The table learning operation in Step 902 may include the following steps (as shown as a process A0 in FIG. 10):

Step A02: Receive a first feedback signal from the load corresponding to a first cycle.

Step A04: Obtain a control code from the table according to the first feedback signal.

Step A06: Generate a control signal according to the control code, wherein the driving sub-circuit circuit performs an operation on a load according to the control signal during a second cycle.

Step A08: Receive a second feedback signal from the load corresponding to the second cycle.

Step A10: Update the control code according to the first feedback signal and the second feedback signal, and save the updated control code back to the table in the memory.

In an embodiment of the process A0, the control code may be referred/corresponding to PWCC, which is not limited thereto. In an embodiment of Step A06, the control signal may be referred to the PWM signal(s), but not limited thereto. In an embodiment of Step A06, the driving sub-circuit circuit may be referred to the bidirectional circuit, which is not limited thereto. In an embodiment of Step A06, the operation may be referred to the charging operation or the discharging operation, which is not limited thereto.

Note that, the processes 90 and A0 may also be applied to the feedback control scheme disclosed in Ser. No. 18/177, 765, which is also within the scope of the present invention.

To sum up, table learning rate may be reduced, in order to spare power consumption, especially power consumed on the memory write operation of table leaning.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method, applied in a controller within a driving circuit comprising a driving sub-circuit configured to drive a load, the method comprising:
   performing a table learning operation on a table at least at a first rate during a learning period; and
   performing the table learning operation on the table at a second rate lower than the first rate after the learning period;
   wherein the table is stored in a memory within the controller;
   wherein performing the table learning operation comprises:
   receiving a first feedback signal from the load corresponding to a first cycle;
   obtaining a control code from the table according to the first feedback signal;
   generating a control signal according to the control code, wherein the driving sub-circuit circuit performs an operation on the load according to the control signal during a second cycle;
   receiving a second feedback signal from the load corresponding to the second cycle; and
   updating the control code according to the first feedback signal and the second feedback signal, and saving the updated control code back to the table in the memory.

2. The method of claim 1, wherein the step of performing the table learning operation at the second rate lower than the first rate comprises:
   performing the table learning operation on a first operation cycle; and
   skipping the table learning operation over a plurality of skipped operation cycles consecutive to the first operation cycle.

3. The method of claim 2, wherein a number of the plurality of skipped operation cycles is constant over a period of time.

4. The method of claim 2, wherein a number of the plurality of skipped operation cycles is randomly generated or chosen from a list comprising random numbers.

5. The method of claim 2, comprising:
   increasing a number of the plurality of skipped operation cycles when a table error decreases; or
   decreasing the number of the plurality of skipped operation cycles when the table error increases;
   wherein the table error is determined according to the first feedback signal and the second feedback signal.

6. The method of claim 5, wherein the number of the plurality of skipped operation cycles is chosen from a predetermined list.

7. The method of claim 1,
   wherein the first feedback signal is captured by an analog-to-digital converter coupled to the load;
   wherein the analog-to-digital converter operates in an analog-to-digital conversion rate.

8. The method of claim 7, wherein the first rate is the analog-to-digital conversion rate.

9. The method of claim 1,
   wherein the control signal is a pulse width modulation (PWM) signal;

wherein the control code is a pulse width control code (PWCC) according to which a pulse width of the PWM signal is determined.

10. The method of claim 1, wherein the operation is a charging operation or a discharging operation; wherein the load is a capacitive load.

11. The method of claim 1, comprising: determining whether the table is stable.

12. A driving circuit, comprising:
a driving sub-circuit, coupled to a load; and
a controller, comprising a memory in which a table is stored, the controller configured to control the driving sub-circuit and perform following steps:
   performing a table learning operation on the table at least at a first rate during a learning period; and
   performing the table learning operation on the table at a second rate lower than the first rate after the learning period;
wherein performing the table learning operation comprises:
   receiving a first feedback signal from the load corresponding to a first cycle;
   obtaining a control code from the table according to the first feedback signal;
   generating a control signal according to the control code, wherein the driving sub-circuit circuit performs an operation on the load according to the control signal during a second cycle;
   receiving a second feedback signal from the load corresponding to the second cycle; and
   updating the control code according to the first feedback signal and the second feedback signal, and saving the updated control code back to the table in the memory.

13. The driving circuit of claim 12, wherein the controller is configured to perform following steps:
   performing the table learning operation on a first operation cycle; and
   skipping the table learning operation over a plurality of skipped operation cycles consecutive to the first operation cycle.

14. The driving circuit of claim 13, wherein a number of the plurality of skipped operation cycles is constant over a period of time.

15. The driving circuit of claim 13, wherein a number of the plurality of skipped operation cycles is randomly generated or chosen from a list comprising random numbers.

16. The driving circuit of claim 13, wherein the controller is configured to perform following steps:
   increasing a number of the plurality of skipped operation cycles when a table error decreases; or
   decreasing the number of the plurality of skipped operation cycles when the table error increases;
   wherein the table error is determined according to the first feedback signal and the second feedback signal.

17. The driving circuit of claim 16, wherein the number of the plurality of skipped operation cycles is chosen from a predetermined list.

18. The driving circuit of claim 12, comprising:
an analog-to-digital converter, coupled to the load;
wherein the first feedback signal is captured by the analog-to-digital converter;
wherein the analog-to-digital converter operates in an analog-to-digital conversion rate.

19. The driving circuit of claim 18, wherein the first rate is the analog-to-digital conversion rate.

20. The driving circuit of claim 12,
wherein the control signal is a pulse width modulation (PWM) signal;
wherein the control code is a pulse width control code (PWCC) according to which a pulse width of the PWM signal is determined.

21. The driving circuit of claim 12, wherein the controller is a PWM controller, and the PWM controller comprises:
a digital-to-analog converter (DAC), configured to convert a pulse width control code (PWCC) into an analog voltage;
a waveform generator, configured to generate a sawtooth signal or a sawtooth-like signal; and
a comparator, configured to compare the sawtooth signal or the sawtooth-like signal with the analog voltage, and produce a comparison result as a PWM signal having a pulse width corresponding to the PWCC.

22. The driving circuit of claim 12, wherein the driving sub-circuit comprises:
an inductor;
a first switch, coupled between a voltage source and a first terminal of the inductor;
a second switch, coupled to the first terminal of the inductor;
a third switch, coupled between the load and a second terminal of the inductor; and
a fourth switch, coupled to the second terminal of the inductor;
wherein the operation is a charging operation or a discharging operation;
wherein during the charging operation, the driving sub-circuit forms a first current flowing toward the load;
wherein during the discharging operation, the driving sub-circuit forms a second current flowing from the load.

23. The driving circuit of claim 12,
wherein the driving circuit receives an input signal;
wherein the controller controls the driving sub-circuit such that an output of the load is substantially proportional to the input signal.

24. The driving circuit of claim 12,
wherein the driving circuit receives an input signal generated according to an original audio signal within an audible band;
wherein the load is a speaker load.

25. The driving circuit of claim 12, wherein the controller is configured to perform following step:
determining whether the table is stable.

* * * * *